United States Patent
Wheeler et al.

(10) Patent No.: US 9,862,841 B2
(45) Date of Patent: Jan. 9, 2018

(54) GROUP IV NANOCRYSTALS WITH ION-EXCHANGEABLE SURFACE LIGANDS AND METHODS OF MAKING THE SAME

(71) Applicant: Alliance for Sustainable Energy, LLC, Golden, CO (US)

(72) Inventors: Lance M. Wheeler, Wheat Ridge, CO (US); Asa W. Nichols, Charlottesville, VA (US); Boris D. Chernomordik, Denver, CO (US); Nicholas C. Anderson, Wheat Ridge, CO (US); Matthew C. Beard, Arvada, CO (US); Nathan R. Neale, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/388,415

(22) Filed: Dec. 22, 2016

(65) Prior Publication Data

US 2017/0183511 A1    Jun. 29, 2017

Related U.S. Application Data

(60) Provisional application No. 62/387,554, filed on Dec. 24, 2015.

(51) Int. Cl.
| | | |
|---|---|---|
| *H01L 31/00* | (2006.01) | |
| *C09D 5/24* | (2006.01) | |
| *C09D 5/32* | (2006.01) | |
| *H01L 31/18* | (2006.01) | |
| *H01L 31/028* | (2006.01) | |
| *H01L 31/0352* | (2006.01) | |

(52) U.S. Cl.
CPC .............. *C09D 5/24* (2013.01); *C09D 5/32* (2013.01); *H01L 31/028* (2013.01); *H01L 31/035218* (2013.01); *H01L 31/1808* (2013.01); *H01L 31/1884* (2013.01)

(58) Field of Classification Search
CPC .......... C08F 4/02; H01L 29/0665; B22F 9/24
USPC ............................. 75/362; 257/29; 502/103
See application file for complete search history.

(56) References Cited

U.S. PATENT DOCUMENTS

| | | | |
|---|---|---|---|
| 7,591,871 B1* | 9/2009 | Gerung | B22F 9/24 75/362 |
| 2001/0018395 A1* | 8/2001 | Ward | C08F 4/02 502/103 |
| 2007/0006914 A1* | 1/2007 | Lee | H01L 31/03529 136/261 |

(Continued)

OTHER PUBLICATIONS

Anderson, N. et al., "Ligand Exchange and the Stoichiometry of Metal Chalcogenide Nanocrystals: Spectroscopic Observation of Facile Metal-Carboxylate Displacement and Binding," Journal of the American Chemical Society, vol. 135, 2013, pp. 18536-18548.

(Continued)

*Primary Examiner* — Khanh Tuan Nguyen
(74) *Attorney, Agent, or Firm* — Michael A. McIntyre

(57) ABSTRACT

Methods are described that include reacting a starting nanocrystal that includes a starting nanocrystal core and a covalently bound surface species to create an ion-exchangeable (IE) nanocrystal that includes a surface charge and a first ion-exchangeable (IE) surface ligand ionically bound to the surface charge, where the starting nanocrystal core includes a group IV element.

18 Claims, 25 Drawing Sheets

(56) References Cited

U.S. PATENT DOCUMENTS

2014/0346442 A1* 11/2014 Nag .................... H01L 29/0665
257/29

OTHER PUBLICATIONS

Buriak, J. M., "Illuminating Silicon Surface Hydrosilylation: an Unexpected Plurality of Mechanisms," American Chemical Society, Chemistry of Materials, vol. 26, 2014, pp. 763-772.

Dasog, M. et al., "Silicon Nanocrystals and Silicon-Polymer Hybrids: Synthesis, Surface Engineering, and Applications," Angewandte Chemie, International Edition, vol. 55, 2016, pp. 2322-2339.

Gerung, H. et al., "Two-photon absorption of matrix-free Ge nanocrystals," American Institute of Physics, Applied Physics Letters, vol. 89, 2006, pp. 111107-1-111107-3.

Guo, Y. et al., "Near-Infrared Photoluminescence Enhancement in Ge/CdS and Ge/ZnS Core/Shell Nanocrystals: Utilizing IV/II-VI Semiconductor Epitaxy," ACS Nano, vol. 8, No. 8, 2014, pp. 8334-8343.

Huck, L. et al., "Toward a Mechanistic Understanding of Exciton-Mediated Hydrosilylation on Nanocrystalline Silicon," Journal of the American Chemical Society, vol. 134, 2012, pp. 489-497.

Lee, D. et al., "Colloidal Synthesis of Infrared-Emitting Germanium Nanocrystals," Journal of the American Chemical Society, vol. 131, No. 10, 2009, pp. 3436-3437.

Mangolini, L. et al., "Plasma-Assisted Synthesis of Silicon Nanocrystal Inks," Advanced Materials, vol. 19, 2007, pp. 2513-2519.

Muthuswamy, E. et al., "Thiol-Capped Germanium Nanocrystals: Preparation and Evidence for Quantum Size Effects," American Chemical Society, Chemistry of Materials, vol. 26, 2014, pp. 2138-2146.

Neale, Nathan R., "Synthesis and Surface Chemistry of Group IV Nanocrystals," presentation to Iowa State University, Sep. 18, 2015, pp. 1-42.

Prabakar, S. et al., "Size Controlled Synthesis of Germanium Nanocrystals by Hydride Reducing Agents and Their Biological Applications," American Chemical Society, Chemistry of Materials, vol. 22, 2010, pp. 482-486.

Ruddy, D. et al., "Size and Bandgap Control in the Solution-Phase Synthesis of Near-Infrared-Emitting Germanium Nanocrystals," ACS Nano, vol. 4, No. 12, 2010, pp. 7459-7466.

Ruddy, D. et al., "Surface Chemistry Exchange of Alloyed Germanium Nanocrystals: A Pathway Toward Conductive Group IV Nanocrystal Films," American Chemical Society, Journal of Physical Chemistry Letters, vol. 4, 2013, pp. 416-421.

Warner, J. et al., "The Synthesis of Silicon and Germanium Quantum dots for Biomedical Applications," Proceedings of SPIE, Colloidal Quantum Dots for Biomedical Applications, vol. 6096, Mar. 27, 2006, pp. 609607-1-609607-8.

Wheeler, L. et al., "Hypervalent surface interactions for colloidal stability and doping of silicon nanocrystals," Nature Communications, vol. 4:2197, Jul. 29, 2013, pp. 1-10.

Wheeler, L. et al., "Silyl Radical Abstraction in the Functionalization of Plasma-Synthesized Silicon Nanocrystals," American Chemical Society, Chemistry of Materials, vol. 27, 2015, pp. 6869-6878.

Yang, C. et al., "Synthesis and Characterization of Germanium/Si-Alkyl and Germanium/Silica Core-Shell Quantum Dots," American Chemical Society, Chemistry of Materials, vol. 11, No. 12, 1999, pp. 3666-3670.

* cited by examiner

GROUP IV NANOCRYSTALS WITH ION-EXCHANGEABLE SURFACE LIGANDS AND METHODS OF MAKING THE SAME

CROSS-REFERENCE TO RELATED APPLICATIONS

This application claims priority to and the benefit of U.S. Provisional Application No. 62/387,554, filed on Dec. 24, 2015, which is incorporated herein by reference in its entirety.

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Size-tunable optical properties and the ability to process thin films using scalable, cost-efficient printing techniques make colloidal nanocrystals (NCs) an attractive candidate for solar cells, light-emitting devices, transistors, photodetectors, and batteries. Colloidal synthesis of conventional NCs using metal-based compound semiconductors (groups III-V, II-VI, and IV-VI) yields non-polar or polar ligands bound to the NC surface through labile Lewis acid-base or ionic surface bonds. Progress in NC materials, and electronics that utilize them, may be advanced by developing methods that enable the manipulation of NC surfaces through displacement of labile native insulating ligands.

Whereas surface manipulation has launched metal-based NCs to the forefront of NC-based optoelectronics research, similar strategies using non-toxic and earth-abundant group IV (e.g. Si, Ge) NCs have largely been unsuccessful owing to the covalent bonds that dominate these nanostructures. Though functionalization of group IV NCs with covalent Si—C or Ge—C bonds (primarily through reaction with an alkene via hydrosilylation or hydrogermylation) can minimize the impacts of oxidation as well as enhance photoluminescence, these group IV-C bonds are kinetically inert and typically do not undergo exchange.

Some advances have been made towards functionalizing group IV NCs to provide ligand exchange surface reactions. However, most studies have resulted in irreversible, incomplete, and/or only quasi-reversible ligand exchange reactions. Thus, there remains a need for methods that provide reversible and complete ligand exchange chemistry to occur on the surfaces of group IV NCs.

SUMMARY

An aspect of the present disclosure is a method that includes reacting a starting nanocrystal that includes a starting nanocrystal core and a covalently bound surface species to create an ion-exchangeable (IE) nanocrystal that includes a surface charge and a first ion IE surface ligand ionically bound to the surface charge, where the starting nanocrystal core includes a group IV element. In some embodiments of the present disclosure, the group IV element may include germanium. In some embodiments of the present disclosure, the covalently bound surface species may include at least one of hydrogen, a saturated hydrocarbon, an unsaturated hydrocarbon, a halogen, and/or a chalcogen. In some embodiments of the present disclosure, the covalently bound surface species may include hydrogen.

In some embodiments of the present disclosure, the surface charge may be substantially negative. In some embodiments of the present disclosure, the first IE surface ligand may include at least one of an alkylammonium ligand, a phosphonium ligand, a hydrazinium ligand, and/or an alkali metal ligand. In some embodiments of the present disclosure, the first IE surface ligand may include at least one of $OAmH^+$, $CH_3(CH_2)_{11}NH_3^+$, $CH_3NH_3^+$, $N_2H_5^+$, and/or $Na^+$. In some embodiments of the present disclosure, the surface charge may be substantially positive. In some embodiments of the present disclosure, the first IE surface ligand may include at least one of $BF_4^-$, $ClO_4^-$, $PF_6^-$, $(C_6H_5)_4B^-$, or $(C_6F_5)_4B^-$.

In some embodiments of the present disclosure, the reacting may replace at least a portion of the covalently bound surface species with the first IE surface ligand. In some embodiments of the present disclosure, after the reacting, at least a portion of the covalently bound surface species may remain covalently bound to the IE nanocrystal. In some embodiments of the present disclosure, the reacting may include contacting the starting nanocrystal with at least one of a reducing agent and/or an oxidizing agent. In some embodiments of the present disclosure, the reducing agent may include at least one of a sulfide, an alkali metal, an alkaline earth metal, an alkyllithium reagent, a Grignard reagent, a metal hydride, sodium borohydride, and/or dihydrogen. In some embodiments of the present disclosure, the oxidizing agent may include at least one of $NOBF_4$, $[(CH_3)_3O][BF_4]$, an elemental halide, and/or an elemental chalcogen.

In some embodiments of the present disclosure, the reacting may include contacting the starting nanocrystal with at least one of a cation-forming species and/or an anion-forming species. In some embodiments of the present disclosure, the cation-forming species may include at least one of an alkali metal salt, hydrazine, ammonia, an amine, and/or a phosphine. In some embodiments of the present disclosure, the method may further include exchanging at least a portion of the first IE surface ligand with a second IE surface ligand. In some embodiments of the present disclosure, the second IE surface ligand may be different from the first IE surface ligand, and the second IE surface ligand may include at least one of an alkylamonium ligand, a phosphonium ligand, a hydrazinium ligand, and/or an alkali metal ligand.

An aspect of the present disclosure is a nanoparticle that includes an IE nanoparticle core that includes a surface charge and a group IV element, and IE surface ligand ionically bound to the surface charge.

An aspect of the present disclosure is a mixture that includes a first IE nanocrystal that includes a group IV element, and a second IE nanocrystal that includes a group IV element, where the first IE nanocrystal is substantially positive in charge, the second IE nanocrystal is substantially negative in charge, and the first IE nanocrystal is ionically bound to the second IE nanocrystal.

BRIEF DESCRIPTION OF THE DRAWINGS

Exemplary embodiments are illustrated in referenced figures of the drawings. It is intended that the embodiments and figures disclosed herein are to be considered illustrative rather than limiting.

REFERENCE NUMBERS

Figure 1A:
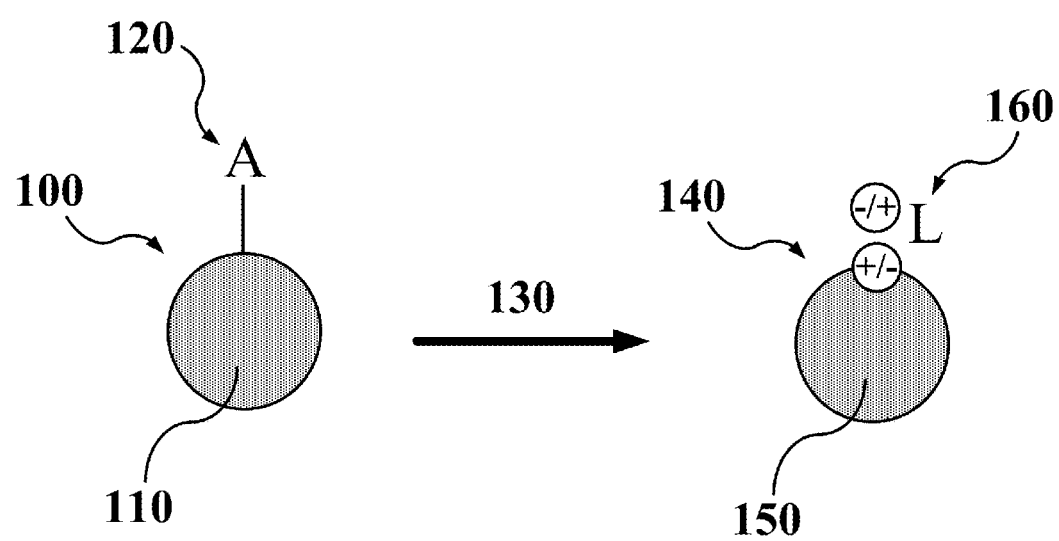
FIGS. 1a through 1g illustrate nanocrystals with ionically bound, IE surface ligands, according to some embodiments of the present disclosure.

100 . . . starting nanocrystal
110 . . . starting nanocrystal core
120 . . . surface species
130 . . . reaction
140 . . . ion-exchangeable nanocrystal
150 . . . ion-exchangeable nanocrystal core
160 . . . ion-exchangeable surface ligand
170 . . . exchange reaction
200 . . . method
210 . . . forming
220 . . . first treating
230 . . . second treating

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein. Embodiments discussed herein are directed to the functionalization of plasma-synthesized Ge NCs by surface reduction that yields Ge NCs suitable for a variety of cationic ligand exchanges, although other methods for synthesizing group IV starting NCs fall within the scope of the present disclosure.

The present disclosure relates to methods for converting starting nanocrystals having covalently bound surface species to nanocrystals having at least some ligands that are ionically bound to surfaces of the converted nanocrystals. In addition, these first ligands that are ionically bound to surfaces of the converted nanocrystals may be reversibly exchanged with other ligands to form second, unique converted nanocrystals having different ionically bound ligands than the first converted nanocrystals. Thus, the present disclosure provides a chemistry set capable of converting nanocrystals having a variety of covalently bound surface species to a wide variety of nanocrystals having a wide variety of reversibly exchangeable ligands that are ionically bound to surfaces of the converted nanocrystals. Such a chemistry set, and the resultant nanocrystals with ion-exchangeable, ionically bound ligands may find significant applications in fields such as solar cells, light-emitting devices, transistors, photodetectors, and batteries. Please note that although the term "nanocrystal" is used throughout this disclosure, the embodiments described herein may apply equally to amorphous material; e.g. nanoparticles.

FIG. 1a illustrates a starting nanocrystal 100 that includes a starting nanocrystal core 110 having at least one surface (e.g. external surface) and a surface species 120 covalently bound to the at least one surface. Only one surface species 120 is shown in FIG. 1a, however, it should be noted that a plurality of surface species 120 may be covalently bound to the surfaces of a starting nanocrystal 100, with the actual number depending on parameters including surface area limitations, steric hindrances, etc. Referring again to FIG.

1a, according to some embodiments of the present disclosure, the starting nanocrystal 100 may be converted by a reaction 130 to an IE nanocrystal 140 that includes an IE nanocrystal core 150 having at least one surface (e.g. external surface) and an IE surface ligand 160 ionically bound to the at least one surface of the IE nanocrystal core 150. As shown in FIG. 1a, a surface of the IE nanocrystal core 150 may possess surfaces charges, at least one of positive and/or negative charges, such that the surface charges are counterbalanced by the IE surface ligand 160 having charges opposite to the surface charges; e.g. positive IE surface ligand charges for negative surface charges and/or negative IE surface ligand charges for positive surface charges. In some embodiments of the present disclosure, an IE nanocrystal core 150a, may have surface charges that are substantially positive. In some embodiments of the present disclosure, a IE nanocrystal core 150a, may have surface charges that are substantially negative. These charge options, e.g. positive, negative, and/or a combination of both, are symbolically indicated in FIGS. 1a and 1g by "+/−" and "−/+". As used herein, the terms "substantially" and "about" refer to the statistical uncertainty involved in measuring numeric values of a parameters and/or variability caused by the nanocrystal system itself. Thus, for example, surface charges that are "substantially negative", refers to the surface charges being 100%, 99.9%, 99%, or 95% negative or within the statistical limits known to one of ordinary skill in the art measuring the surface charges of a NC. In some embodiments of the present disclosure, a surface species 120 may include at least one of hydrogen, an alkyl group, and/or an aryl group. In some embodiments of the present disclosure, an alkyl group may be linear and/or branched, for example, a methyl group, an ethyl group, a propyl group, an isopropyl group, a butyl group, an s-butyl group, a t-butyl group, and/or any suitable larger molecular weight alkyl group. In some embodiments of the present disclosure, an aryl group may be any suitable branched, linear, and/or cyclic unsaturated hydrocarbon.

Figure 1B:
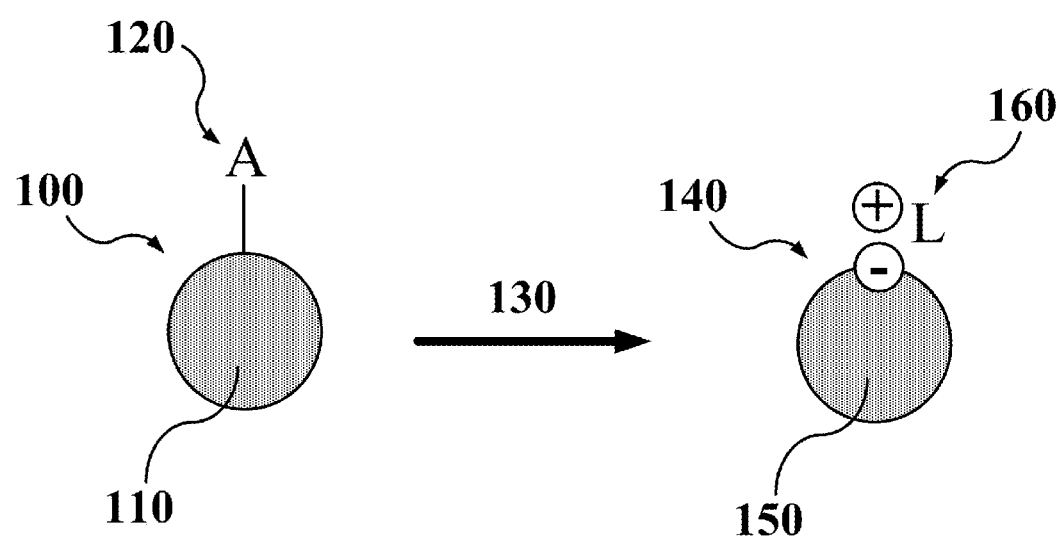
Figure 1C:
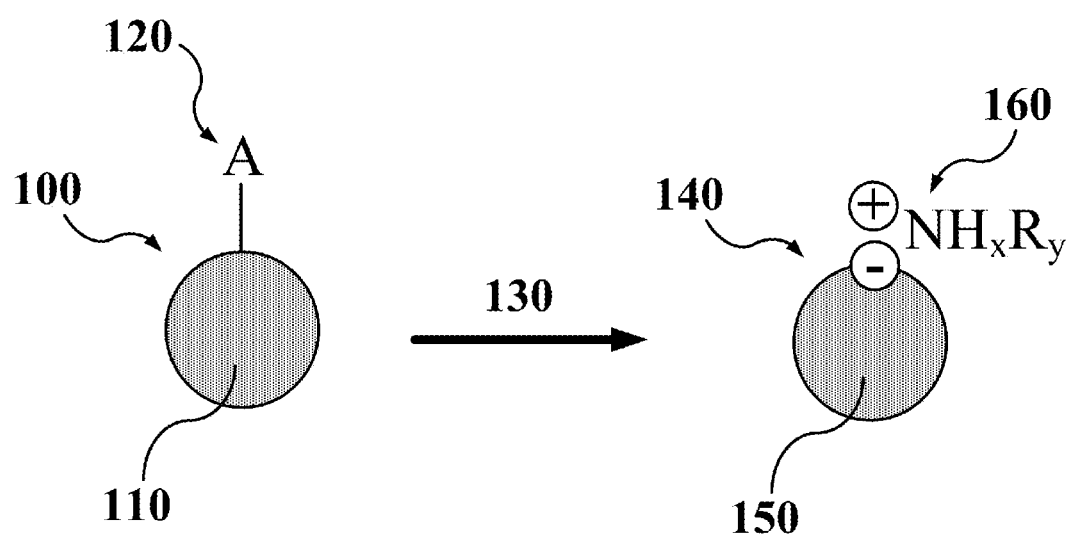
Figure 1D:
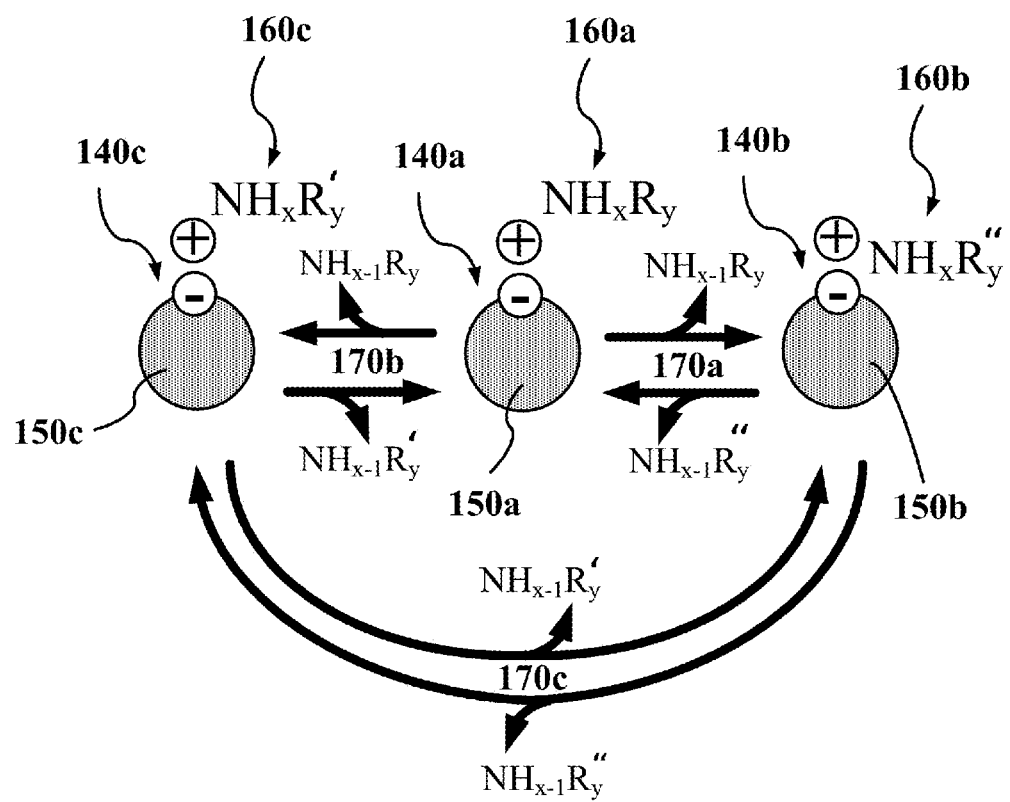
Figure 1E:
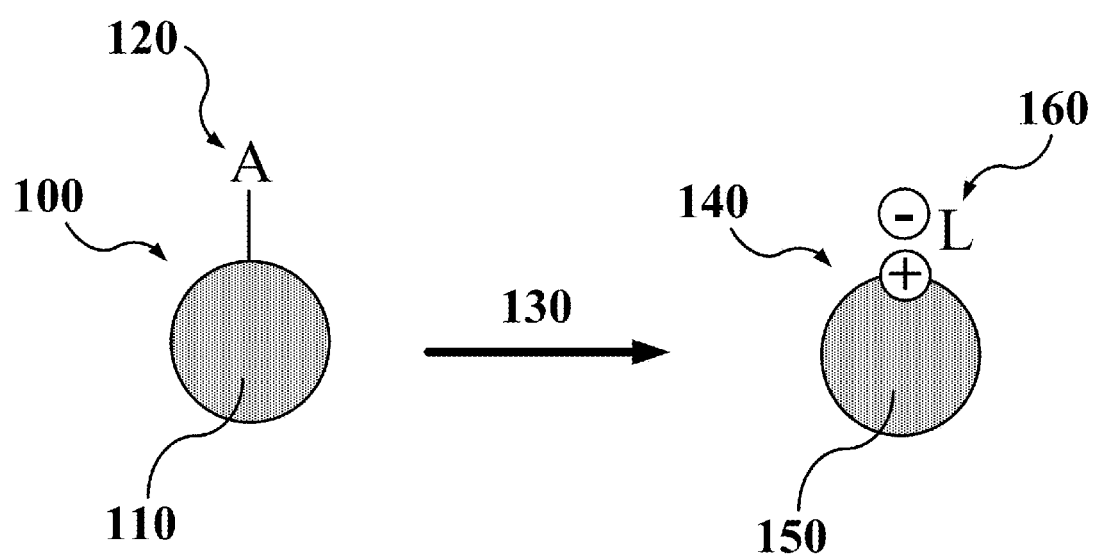
Figure 1F:
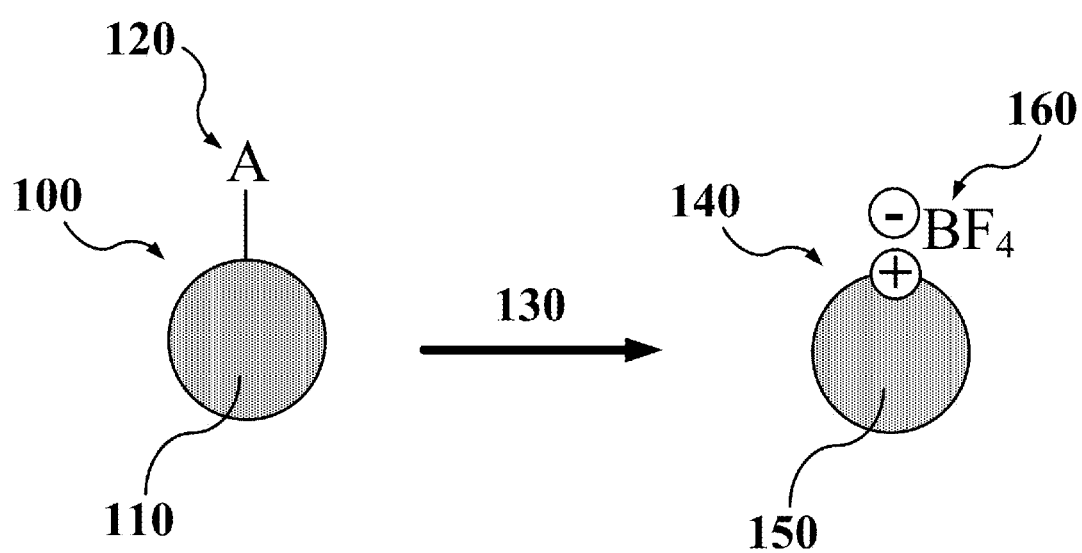

FIG. 1b illustrates an example where a surface species 120 covalently bound to a surface of starting nanocrystal 100 is converted by a reaction 130, as described herein, to an IE nanocrystal 140 having an IE nanocrystal core 150 having surfaces containing negative surface charges, such that a cationic IE surface ligand 160 counterbalances the surface charges and ionically binds to the IE nanocrystal core 150. FIG. 1c illustrates a more specific example of FIG. 1b, where the cationic IE surface ligand 160 is in the form of an alkylammonium ion. As described herein, the IE surface ligand 160 may then be reversibly replaced/exchanged with a variety of other, different IE surface ligands. Thus, referring to FIG. 1d, a first IE nanocrystal 140a having a first IE surface ligand 160a ionically bound to a surface of the first IE nanocrystal 140a may be converted by a first exchange reaction 170a to a IE nanocrystal 140b having a second IE surface ligand 160b ionically bound to a surface of the second IE nanocrystal 140b. Alternatively, or in addition to, the first IE nanocrystal 140a having the first IE surface ligand 160a may be converted by a second exchange reaction 170b to third IE nanocrystal 140c having a third IE surface ligand 160c ionically bound to surfaces of the third IE nanocrystal 140c. FIG. 1d also shows that the second IE nanocrystal 140b and the third IE nanocrystal 140c may be reversibly converted to the other by exchange reaction 170c by exchanging their respective IE surface ligands (160b and 160c). Thus, as described herein, a variety of chemically unique positive-charged surface ligands may be reversibly exchanged with each other to provide a variety of chemically unique ion-exchangeable nanocrystals. FIG. 1e illustrates an example where a surface species 120 covalently bound to a surface of a starting nanocrystal 100 is converted by a reaction 130, as described herein, to an IE nanocrystal 140 having an IE nanocrystal core 150 having surfaces containing positive surface charges, such that an anionic IE surface ligand 160 counterbalances the surface charges and ionically binds to the IE nanocrystal core 150. FIG. 1f illustrates a more specific example of FIG. 1e, where the anionic IE surface ligand 160 is in the form of a tetrafluoroborate ion ($BF_4^-$), for example by abstracting a halide ligand such as fluoride ($F^-$) using trifluoroboron ($BF_3$) to give a positively charged IE nanocrystal core 150 and an anionic IE surface ligand $BF_4^-$ 160. Thus, similar to the reversible exchange of a variety of positive-charged IE surface ligands as shown in FIG. 1d, a variety of chemically unique negative-charged surface ligands may be reversibly exchanged with each other to provide a variety of chemically unique ion-exchangeable nanocrystals having negative-charged surface ligands.

Thus, as illustrated in FIG. 1d, the exchange reactions (170a-c) may be reversible equilibrium reactions such that a final IE nanocrystal (160a-c) attained may depend upon the relative concentrations of the cation- and/or anion-forming species provided in the reaction mixture; e.g. $NH_{x-1}R_y$, $NH_{x-1}R_y$, $NH_{x-1}R_y$, and/or any suitable anion-forming species etc. Referring again to FIG. 1d, in some embodiments of the present disclosure, an exchange reaction, e.g. 170a-c, may result in no change between a first IE nanocrystal core (170a-c) and a subsequent IE nanocrystal core (170a-c). Thus, the change incurred from an ion-exchange reaction may only result in the exchange of the IE surface ligands (160a-c), such that the physical and/or compositional properties of the IE nanocrystal core (150a-c) remain unchanged. The same may be true for ligand exchanges interconverting anionic species 160d.

Figure 1G:
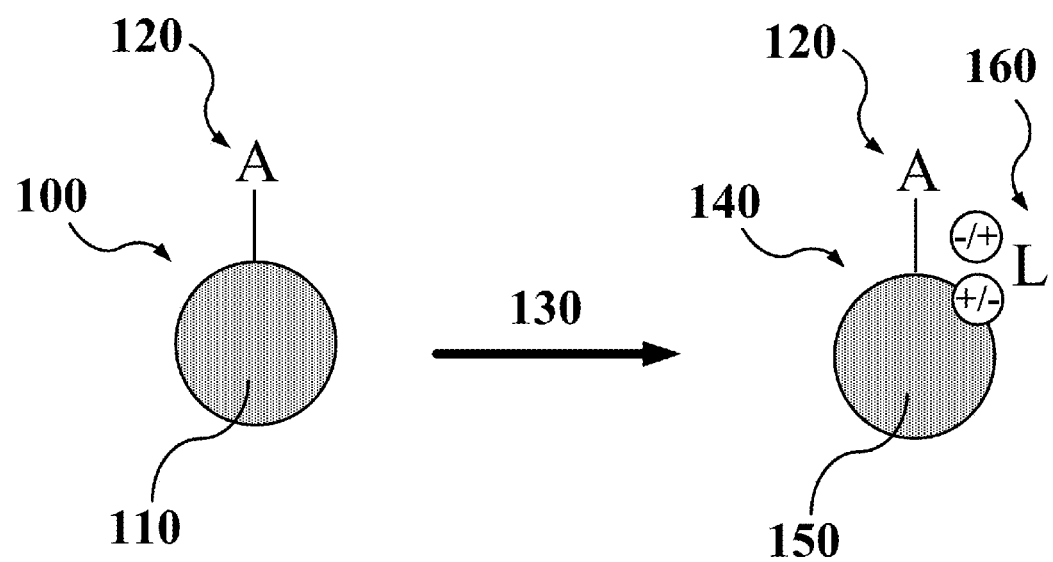

Referring to FIG. 1g, in some embodiments of the present disclosure, a reaction 130 may not remove the surface species 120 from a starting NC 100. Instead, a reactant may remove an electron or a hole from the surface species 120, resulting in the creation of a positive and/or negative surface charge on an IE NC core 150 of an IE NC 140 as described above for FIG. 1a. In some embodiments of the present disclosure, such a surface charge may be substantially positive, such that a negative-charged IE surface ligand 160 may ionically bind with the positive surface charge of the IE NC core 150 of the IE NC 140 still having the surface species 120 covalently bound to IE NC core 150. In some embodiments of the present disclosure, such a surface charge may be substantially negative, such that a positive-charged IE surface ligand 160 may ionically bind with the negative surface charge of the IE NC core 150 of the IE NC 140 still having the surface species 120 covalently bound to IE NC core 150. Referring again to FIG. 1g, for the example of an IE NC core 150 having a positive surface charge, a reaction 130 may include reacting a starting NC 100 having a surface species 120 with $NOBF_4$ such that a NO radical cation removes an electron from starting NC 100 without the removal of the surface species 120, resulting in an IE NC 140 having a IE NC core 150 having a positively charged surface and the surface species 120, and resulting in the formation of NO. This cationic IE NC 140a may then have the same associated anionic IE surface ligand 160, $BF_4^-$, as shown in FIG. 1f, but prepared via a totally different oxidizing agent. Referring again to FIG. 1g, a reaction 130 may be accomplished electrochemically such that the NC surface is charged via electrons or holes derived from an electrode surface; e.g. the surface charge may be either positive and/or negative.

In some embodiments of the present disclosure, a starting nanocrystal core (and thus a starting nanocrystal) may include any group IV element, including at least one of carbon, silicon, germanium, tin, and/or lead. In addition, in some embodiments of the present disclosure, a starting nanocrystal core may include group IV nanoparticles that contain regions co-alloyed and/or co-doped with at least one main group element (boron, nitrogen, phosphorous, and/or arsenic, etc.) on the surface of the starting nanocrystal core. As an example, a surface boron atom (itself with/without surface ligands such that it has neutral charge; e.g. $Si_3$—B (no surface ligands), $Si_2$—BH (one H surface ligand), and/or Si—$BH_2$ (two H surface ligands)) may be reacted via a reaction to yield an IE nanocrystal having a boron as a surface species that remains covalently bound to the IE nanocrystal core, but additionally, the boron is also covalently bound to another species X such that the IE nanocrystal core results in an overall negative charge on a surface of the IE nanocrystal core to which a positively charged surface ligand may ionically balance the negative charge. As another example, a starting nanocrystal having a starting nanocrystal core with a surface having phosphorous atoms (itself with/without surface ligands such that it has neutral charge; e.g. $Si_3$—P (no surface ligands), $Si_2$—PH (one H surface ligand), and/or Si—$PH_2$ (two H surface ligands)) may be reacted resulting in an IE nanocrystal having a IE nanocrystal core with a surface containing phosphorous and a surface species X covalently bound to the phosphorous resulting in an IE NC core having a surface with an overall positive charge. A negatively charged surface ligand may then ionically balance the positive surface charge by ionically binding to the positive surface charge. Together, it may be possible that an IE surface ligand is itself an IE nanocrystal with the opposite charge of a complementary IE nanocrystal, such that a first IE nanocrystal, e.g. X—B (NC)$^-$, may have a second complementary IE nanocrystal, X—P(NC)$^+$, as its positively charged IE surface ligand, and vice versa. It is also conceivable that such conditions of both X—B(NC)$^-$ and X—P(NC)$^+$ may exist on the same nanocrystal, and that such nanocrystal ion-exchangeable interactions may exist between individual parts of any nanocrystals.

A starting nanocrystal core may have a characteristic diameter between about 1 nm and about 2,500 nm, or a characteristic diameter between about 1 nm and about 100 nm. A starting nanocrystal core may be in the shape of a sphere, a tube, a rod, any other suitable geometric shape, any irregular shaped, and/or combination thereof. Referring again to FIG. 1a, a surface species 120 may be hydrogen covalently bound to a surface of the starting nanocrystal 100. Other potential examples of covalently bound surface species include elements such as boron, carbon, nitrogen, oxygen, fluorine, aluminum, silicon, phosphorous, sulfur, chlorine, gallium, germanium, arsenic, bromine, indium, tin, antimony, and/or iodine. In some embodiments of the present disclosure, the starting nanocrystal core 110 may be identical or nearly identical to the converted IE nanocrystal core 150. Similar to a starting nanocrystal core 110, an IE nanocrystal core 150 (and thus an IE nanocrystal 140) may include any group IV element, including at least one of carbon, silicon, germanium, tin, and/or lead. In addition, in some embodiments of the present disclosure, an IE nanocrystal core 150 may include group IV nanoparticles that contain regions co-alloyed and/or co-doped with at least two main group elements (boron, nitrogen, phosphorous, and/or arsenic, etc.) on a surface of the IE nanocrystal core 150. An IE nanocrystal core 150 may have a characteristic diameter of about 1 nm to about 2,500 nm, or a characteristic diameter of about 1 nm to about 100 nm. An IE nanocrystal core 150 may be in the shape of a sphere, a tube, a rod, any other suitable geometric shape, any irregular shaped, and/or combinations thereof.

In some embodiments of the present disclosure, an IE surface ligand may include at least one species described by $NR_xH_y^+$ where R represents an organic or inorganic group and y=4−x. Thus, an IE surface ligand may include the cation-form of an amine, including at least one of a primary amine, a secondary amine, tertiary amine, and/or quaternary amines, and inorganic derivatives thereof, such as hydrazine. The organic group R may include alkyl groups such as methyl, ethyl, butyl, and/or any other straight-chained, branched or cyclic, saturated hydrocarbon. The organic group R may also include unsaturated straight-chained, branched or cyclic hydrocarbons, such as aromatic groups. The inorganic group R may include amide or substituted amides, silyl groups, or any other inorganic species. Some examples of IE surface ligands include alkylammonium ligands such as oleylammonium, dodecylammonium, and/or methylammonium. In some embodiments of the present disclosure, IE surface ligands 160a may include phosphines. Phosphine surface ligands may include the cation-form of a phosphine. Thus, an IE surface ligand may include at least one species described by $PR_xH_y^+$ where R represents an organic or inorganic group and y=4−x.

Figure 2:
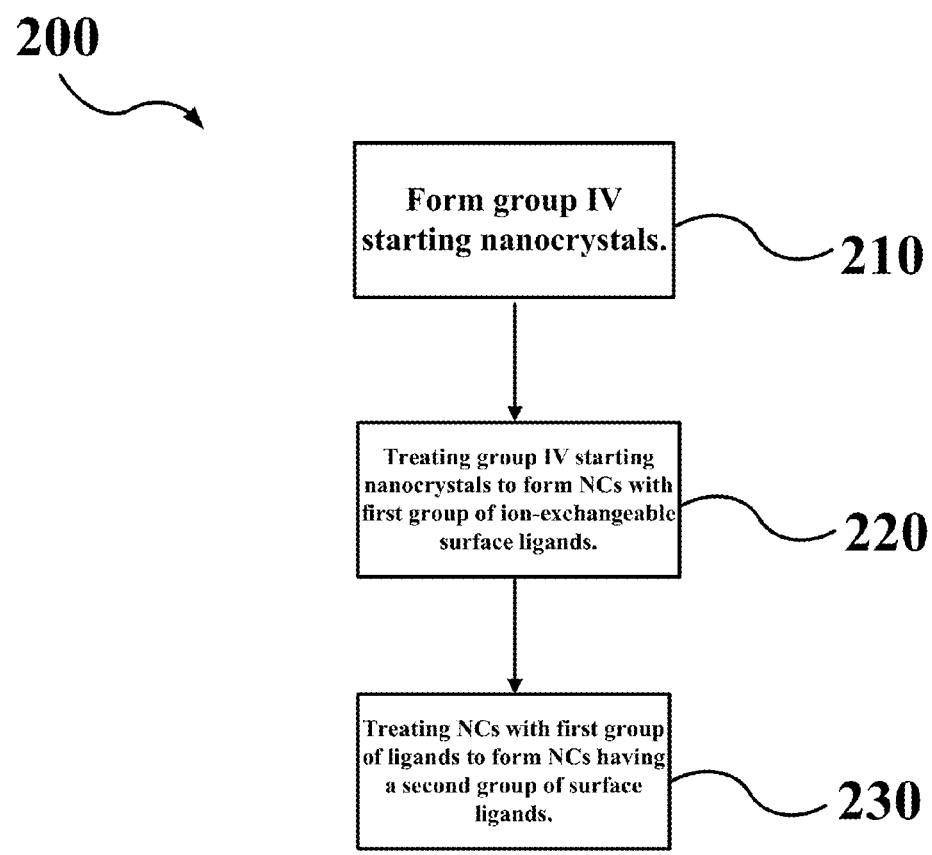
FIG. 2 illustrates a method for producing a variety of group IV nanocrystals having IE surface ligands, according to some embodiments of the present disclosure.

FIG. 2 illustrates a method 200 for producing a variety of group IV nanocrystals having ion-exchangeable surface ligands, according to some embodiments of the present disclosure. The method 200 begins with the forming 210 of a starting nanocrystal (as shown in FIGS. 1a through 1c). For example, synthesis methods (e.g. forming 210) may be used to form a plurality of group IV nanocrystals having a variety of surface species, for example hydrogen as described above. The forming 210 of the precursor nanocrystals may be accomplished, for example, by the radio frequency (RF) plasma treatment of a group IV starting material such as $GeH_4$. Examples of other methods may include but are not limited to microwave plasma treatment of a group IV starting material such as $SiH_4$; thermal treatment of a group IV starting material such as $SiH_4$; thermal treatment of a group IV starting material such as silicon sub-oxide ($SiO_{2-x}$ where x<2) followed by dissolution of the resulting $SiO_2$ matrix liberating starting group IV nanocrystals; colloidal methods such as reduction of group IV halide precursors $GeI_2$ and $GeI_4$ using n-butyllithium or lithium aluminum hydride. In these latter colloidal methods such as those pioneered by the Inventors and others, the as-prepared soluble species may themselves be charged nanocrystals 140a capable of ion-exchange chemistry described herein such that the synthesis and treatment steps 210 and 220, respectively, may occur in a single process. The method 200 may then continue with a first treating 220 for converting the starting nanocrystals (e.g. H-terminated nanocrystals) to a first plurality of IE nanocrystals having a first plurality of ion-exchangeable surface ligands as shown in FIG. 1a through 1f and described above. For example, the first treating 220 may be performed by contacting the starting nanocrystals (e.g. H-terminated nanocrystals) with a solution that includes a first solvent, a reducing agent (e.g. sulfide anions), and first reactants having the ligands of choice. Treatment of starting nanocrystals may be provided by chemical species other than sulfide anions. In general, any suitable reducing agent may be used in place of or in addition to sulfide anions. Examples of reducing agents include nucleophiles such as the anionic form of halogens. Other reducing agents suitable for embodiments of the present disclosure include anions provided by compounds having sodium, lithium, potassium, and/or other suitable counter-ions, where such compounds include $NaOCH_3$, $LiCH_3$ (or any RLi), NaOH, KOH, NaCN, KCN, NaCCR, $NaNH_2$, $NaNH_4$, $NaNR_2$, NaI, LiBr, KI, and/or $NaN_3$. Still other reducing agents include amines and/or phosphines such as oleylamine and butylphosphine. Gas-phase reductions also are possible using reagents such as $H_2$ and/or $NH_3$. In addition, electrochemical reduction would accomplish transformation 220 via the reaction scheme shown in FIG. 1g. Oxidizing reagents such as $NOBF_4$, Meerwein's salt (triethyloxonium tetrafluoroborate, $[(CH_3CH_2)_3O][BF_4]$), elemental halides ($F_2$, $Cl_2$, $Br_2$, $I_2$), elemental chalcogens ($O_2$, $S_8$ and other S allotropes, black Se and other Se allotropes, and crystalline or amorphous Te) in solution or gaseous forms are some of the possible oxidants. In addition, electrochemical oxidation would accomplish transformation 220 via the reaction scheme shown in FIG. 1g. In some embodiments of the present disclosure, the forming 210 of the starting nanocrystals and the treating 220 of the IE nanocrystals may be combined into a single step.

For example, for the case where the target IE surface ligand is an alkylammonium group, a corresponding alkyl amine may be included in the solution for the first treating 220. If a group IV nanocrystal having ion-exchangeable oleylammonium ions is desired, oleylamine may be included in the solution. For the example where the reducing agent is sulfide ions, the sulfide ions may be supplied by providing ammonium sulfide to the first solution. The first solvent utilized in the solution may be any solvent that provides suitable solubility of the reducing agent (e.g. ammonium sulfide) and the reactants providing the target ligands. Examples of solvents suitable for the present disclosure include at least one of water, alcohols, pentane, hexane, cyclohexane, benzene, chloroform, diethyl ether, toluene, and/or dichloromethane.

Thus, the first treating 220 may result in the formation of a first plurality of group IV IE nanocrystals having a first group of IE surface ligands. As these ligands are "ion-exchangeable", a second treating 230 may be performed to exchange at least a portion of the first group of IE surface ligands resulting from the first treating 220 with a second group of IE surface ligands to produce a second plurality of group IV IE nanocrystals. Similarly, additional treating steps may be performed, as many times as needed to achieve a desired result, to exchange at least a portion of the second group of IE surface ligands on the second plurality of group IV IE nanocrystals with one or more other IE surface ligands. Thus, the second treating 230 (or one or more subsequent treating steps) may be performed by contacting at least a portion of a plurality of IE nanocrystals having IE surface ligands with one or more additional solutions that include one or more additional solvents and reactants having the replacement ligands of choice. For example, if the final target IE surface ligand is methylammonium, methylamine may be included in the solution used in treating steps after the first treating 220. The second solvent utilized in the second solution may be any solvent that provides suitable solubility of the reactants providing the target ligands. Examples of solvents suitable for the present disclosure include at least one of water, pentane, hexane, cyclohexane, benzene, chloroform, diethyl ether, toluene, and/or dichloromethane.

EXAMPLES

Figure 3:
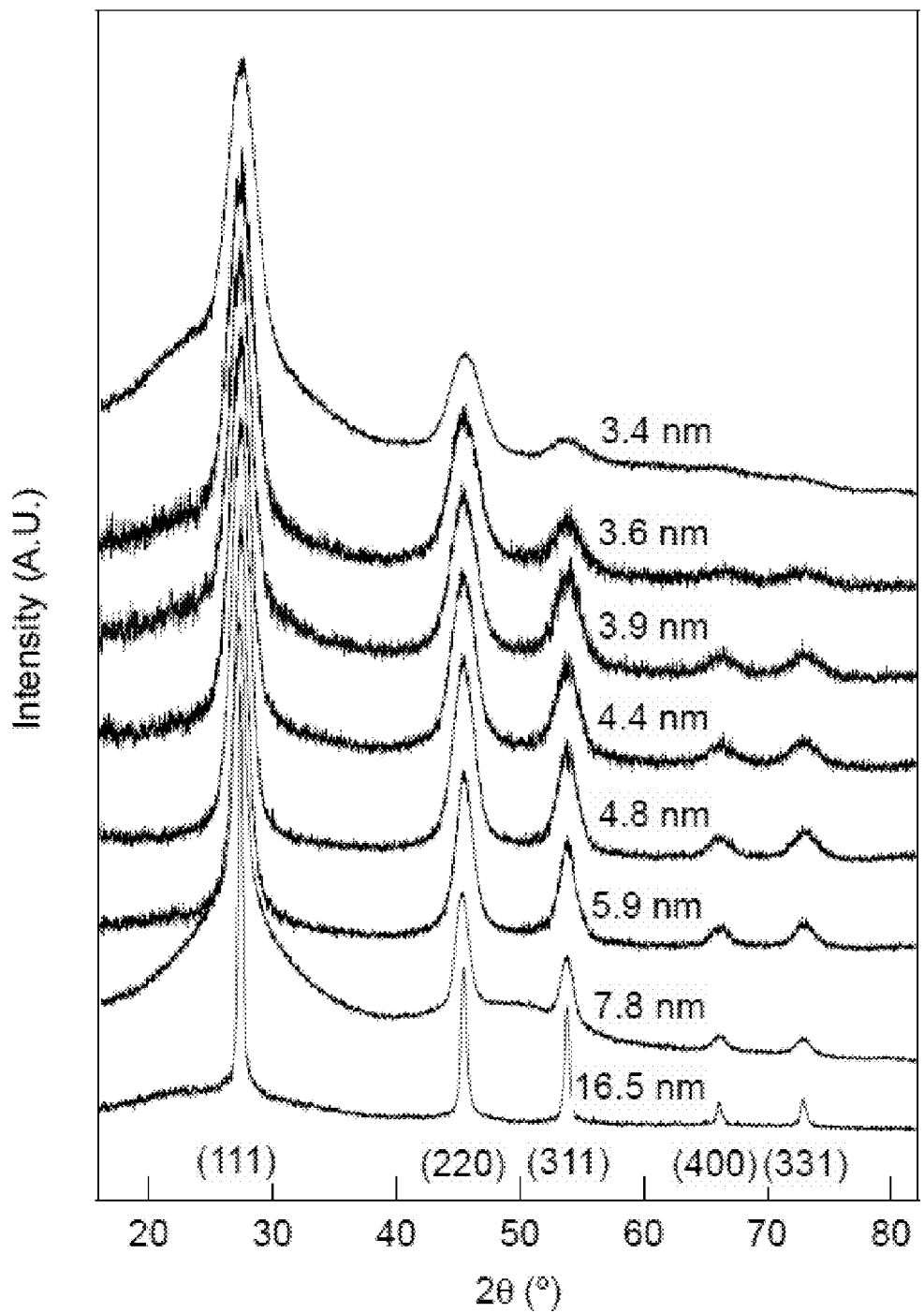
FIG. 3 illustrates X-ray diffraction patterns of Ge starting NCs synthesized in a non-thermal plasma, according to some embodiments of the present disclosure. Synthesis conditions are summarized in Table 1.

Non-thermal plasma decomposition of $GeH_4$ gas provided hydride-terminated Ge starting NCs that were activated by a mixture of aqueous ammonium sulfide (20 wt %)/oleylamine (OAm)/toluene (1:10:50 by volume). Typical reaction times were about 12 hours, at which point a dark, uniform toluene phase separated from a colorless aqueous phase that signified the Ge starting NCs had been reacted to create ion-exchangeable nanocrystals having $OAmH^+$ion-exchangeable surface ligands. The reaction was successful for a number of different Ge starting NC sizes ranging from 3.4 nm to 16.5 nm according to Scherrer broadening analysis of the X-ray diffraction patterns (see FIG. 3). All subsequent experiments and discussion were based on 7.8 nm sized NCs. Full details on Ge starting NC synthesis via nonthermal plasma decomposition of $GeH_4$ and post-synthesis surface activation and ligand functionalization are provided below.

Figure 4A:
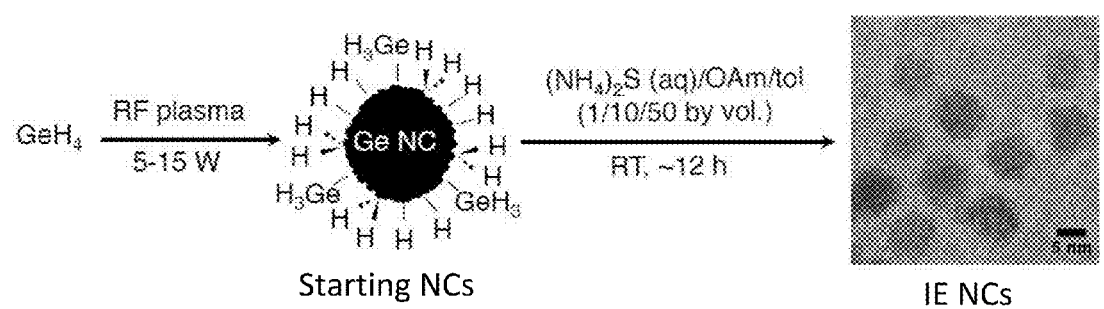
FIG. 4a illustrates a reaction scheme for hydride-terminated Ge starting NCs synthesized in a RF plasma and subsequently functionalized by reaction with an oleylamine (OAm)/ammonium sulfide (($NH_4$)$_2$S)/toluene (tol) mixture, according to some embodiments of the present disclosure. The reaction yields soluble, single-isolated Ge IE NCs, as seen in the TEM image for a 7.8 nm sample.
Figure 4B:
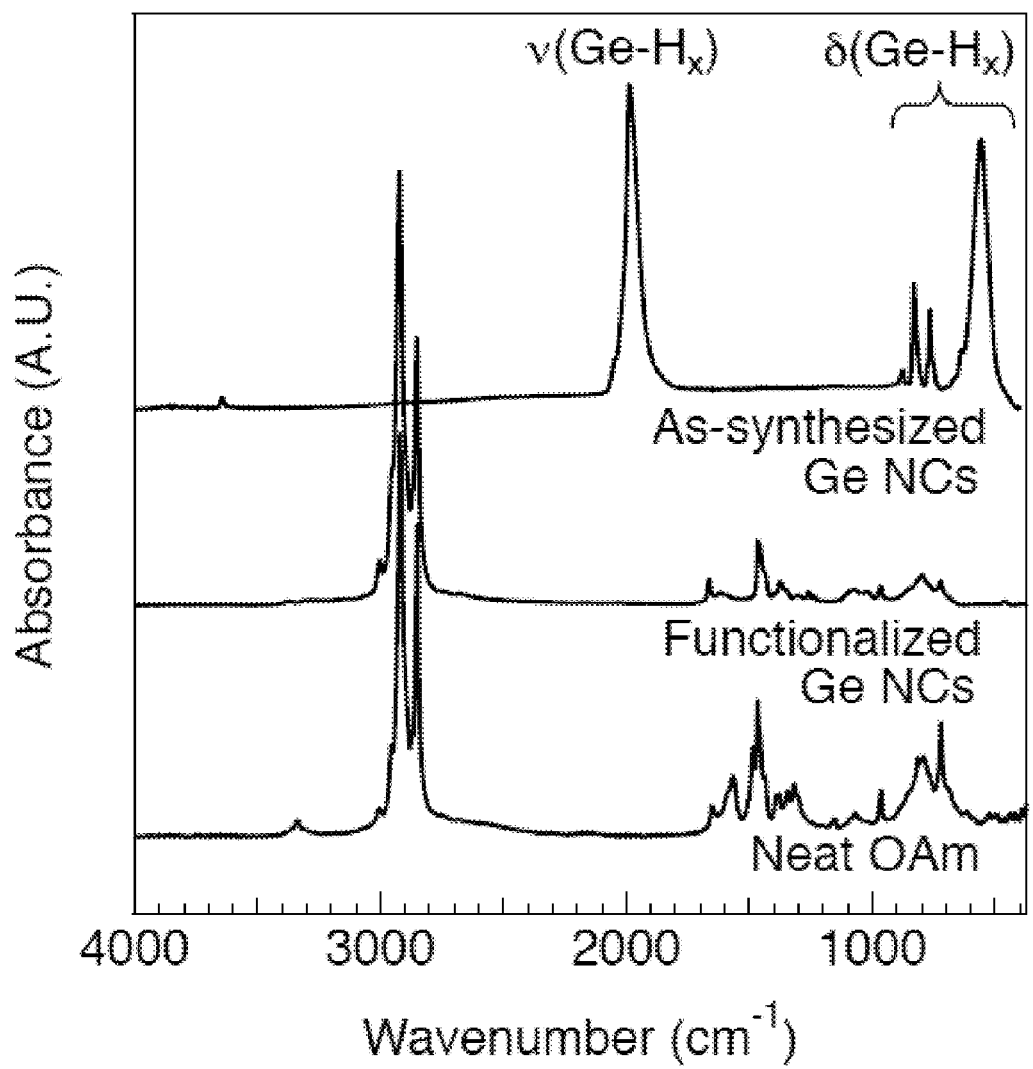
FIG. 4b illustrates FTIR spectra of as-synthesized 7.8 nm Ge starting NCs, Ge IE NCs after functionalization, and neat OAm as reference, according to some embodiments of the present disclosure.

FIG. 4a shows the reaction scheme as well as a transmission electron microscopy (TEM) image of 7.8 nm Ge IE NCs following surface activation with sulfide. The TEM image clearly shows the Ge IE NCs formed a soluble product of singly isolated Ge IE NCs that were characterized by ligand-functionalized NC surfaces. The inter-nanocrystal spacing of ~2.7 nm is consistent with the distance of interpenetrating OAm molecules, suggesting that the OAm was the surface ligand at the Ge IE NC surface following sulfide treatment. Further insight into the Ge IE NC surface chemistry is revealed by FTIR spectroscopy, which shows that the native surface hydrides $*GeH_x$—characterized by stretching (~2000 cm$^{-1}$) and deformation (400 to 900 cm$^{-1}$) modes—were removed completely, and vibrations consistent with OAm surface ligands see FIG. 4b) dominated the spectrum after reaction with sulfide. Interestingly, germanium oxide peaks, indicated by Ge—O—Ge stretching modes expected to be centered at 850 cm$^{-1}$, were not observed despite reaction in aqueous solution. This is consistent with the solubility of $GeO_x$ in water and aqueous stability of planar Ge in the presence of a strong reducing agent such as the citrate anion. Additionally, no Ge—S frequencies (expected between 550 and 670 cm$^{-1}$) were found, suggesting that sulfur was not incorporated into the NCs and that OAm interacts directly with the Ge IE NC core surface after reduction by $S^{2-}$ or $SH^-$ species present during the reaction.

Figure 4C:
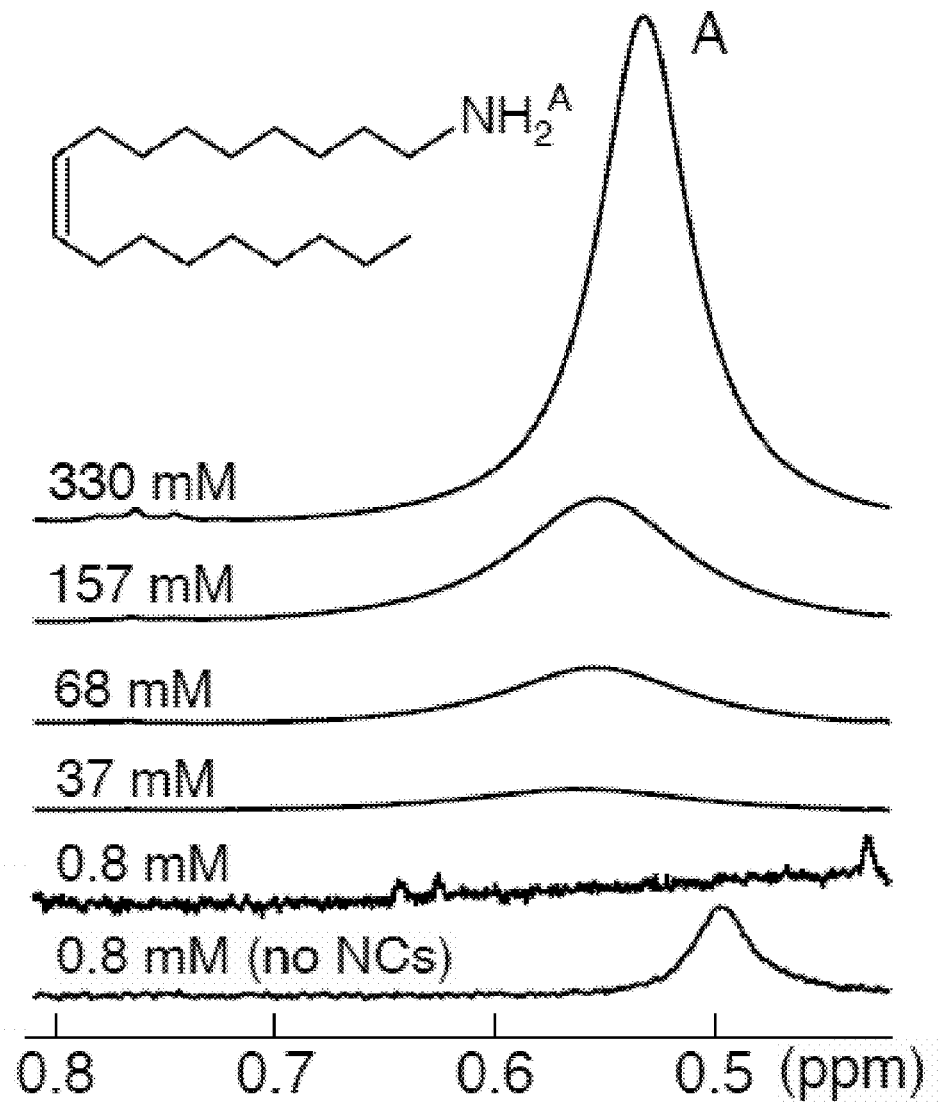
FIG. 4c illustrates $^1$H NMR spectrum of functionalized 7.8 nm Ge IE NCs in toluene-$d_8$ and subsequent spectra following dilution with OAm and a reference spectrum of OAm without Ge IE NCs, according to some embodiments of the present disclosure. Spectra are normalized to a $Cp_2Fe$ internal standard.
Figure 5A:
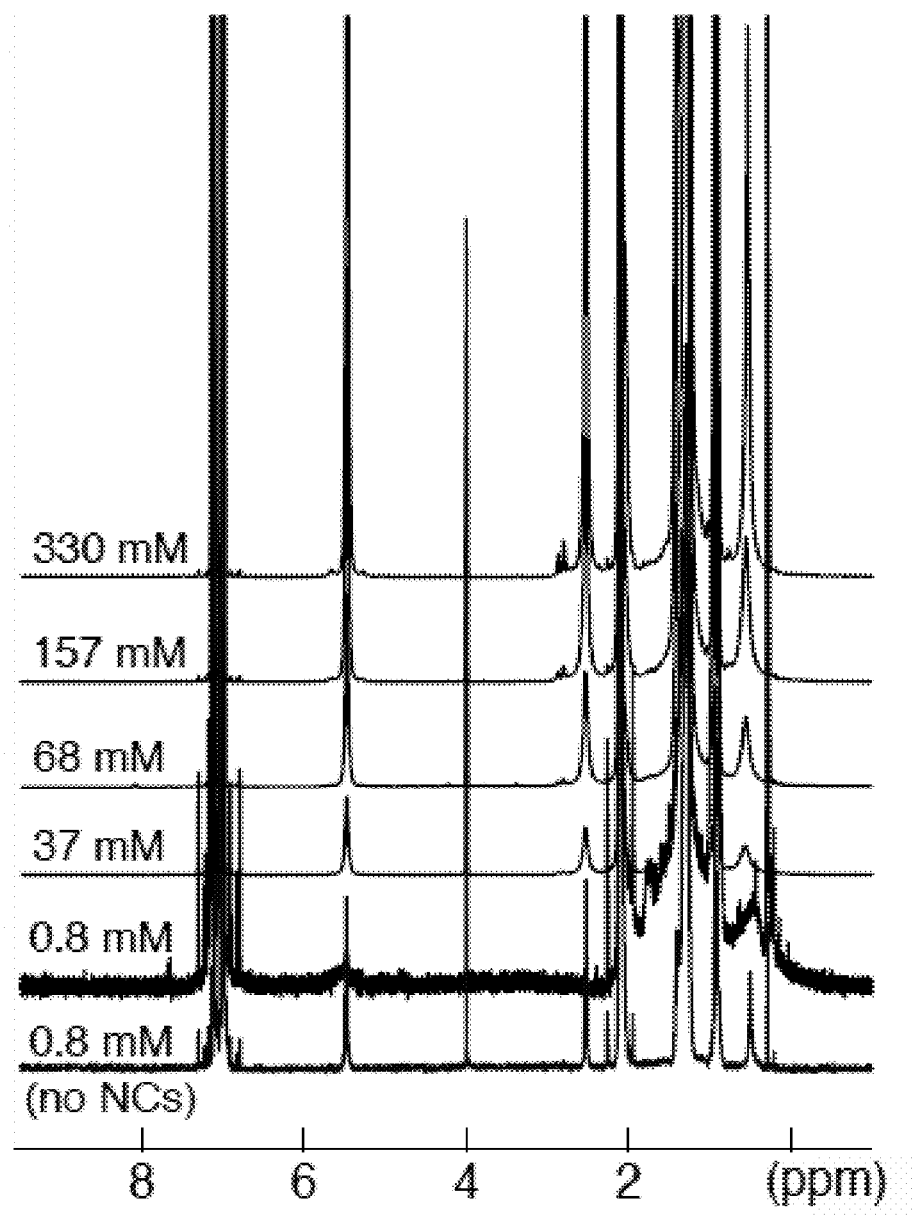
FIGS. 5a-c illustrate full $^1$H NMR for NCs synthesized by methods, according to some embodiments of the present disclosure.
Figure 5B:
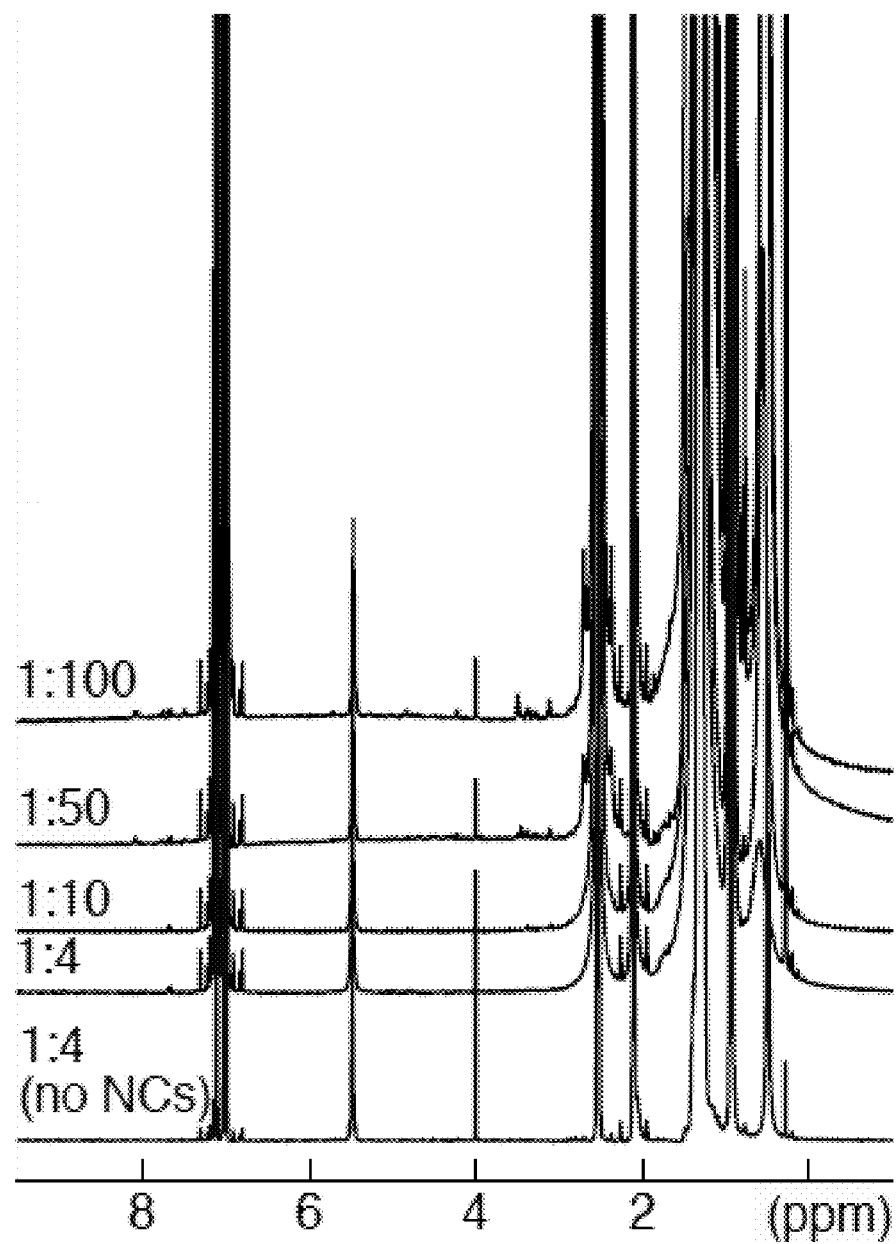
Figure 5C:
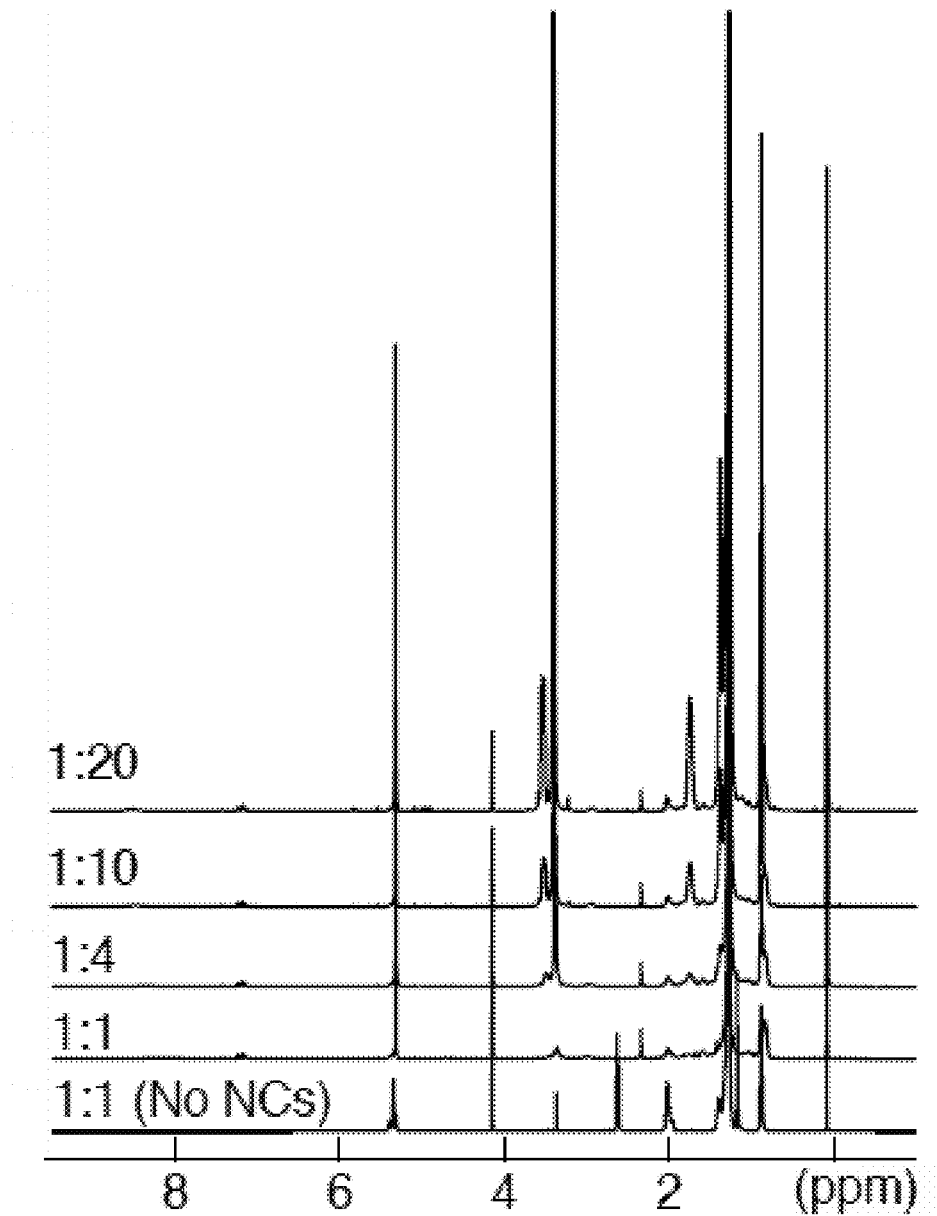

$^1$H nuclear magnetic resonance (NMR) experiments were used to further probe the hypothesis that sulfide activation chemistry results in $OAmH^+$-functionalized Ge IE NCs. The $^1$H NMR spectra in FIG. 4c show the amino proton resonance ($H^4$) region of $OAmH^+$. It was found that functionalized Ge IE NCs purified by washing three times with methanol may need small amounts of OAm (~5 μL/mg Ge NCs) to re-disperse in toluene-$d_8$, resulting in an OAm concentration of 0.8 mM as determined by integration of the vinylic proton resonance of OAm relative to a ferrocene ($Cp_2Fe$) internal standard (see FIGS. 5a-5c for full $^1$H NMR spectra showing aliphatic region). There are two notable features in the $^1$H NMR spectrum of the functionalized and re-dispersed Ge IE NCs when compared to OAm at the same concentration without Ge IE NCs: (1) All proton resonances in the spectrum of functionalized Ge IE NCs are broadened in comparison to the resonances from the free molecules; and (2) The signal from the amino protons in the Ge IE NC sample is so broad that it is buried in the baseline, which is in stark contrast to sharper amino proton resonance of the OAm reference at the same concentration. These data indicate that OAm molecules are rapidly exchanging between the nanocrystal core surfaces and the solution.

This rapid exchange was observed even when ligands greatly outnumber the Ge NCs. A concentration of 0.8 mM OAm corresponds to $1.6 \times 10^3$ ligands/NC for 7.8 nm Ge starting NCs. This is a factor of five more ligands than could possibly closely pack at a Ge IE NC core surface (assuming a ligand cross-sectional area of 0.18 nm$^2$ typical of dense monolayers of molecules with a long hydrocarbon chain) and further verifies that the surface ligands are highly fluxional. Broadening is apparent even as the OAm concentration is increased by three orders of magnitude (see FIG. 4c). The OAm amino proton resonance emerges from the baseline and shifted up field due to concentration but is still broader than the free OAm amino peak, which indicates that ligands freely exchanged with the Ge IE NC core surface at room temperature on the NMR time scale. This result appears to rule out covalent attachment of OAm groups by a Ge—NHR interaction, where no surface exchange with free RNH$_2$ would be expected since such transamination reactions with Ge amides typically need acidic conditions at room temperature.

Figure 6A:
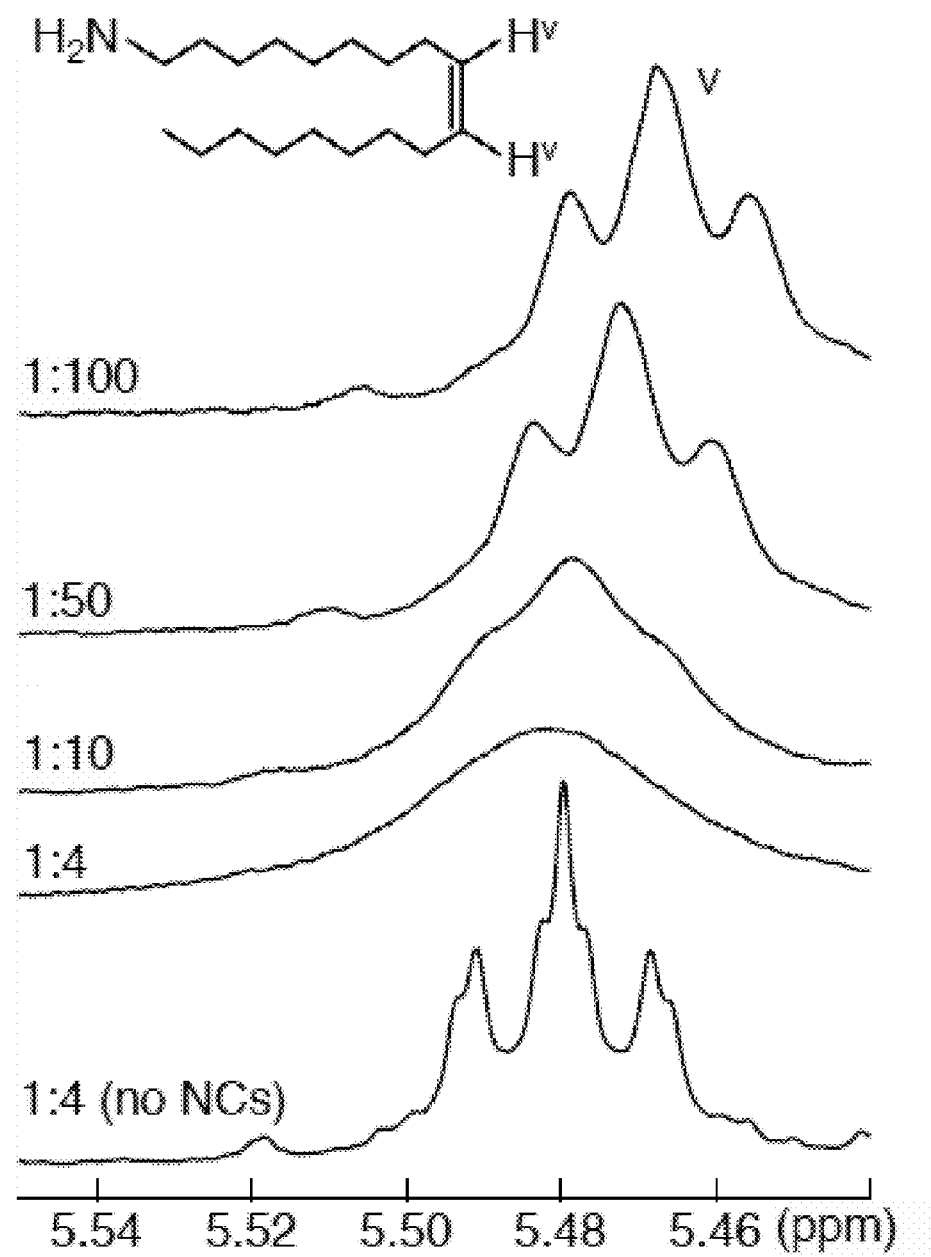
FIG. 6a illustrates $^1$H NMR spectra of Ge NCs in toluene-$d_8$ after three methanol washes and dilution with hexadecylamine and a OAm reference spectrum without Ge NCs, according to some embodiments of the present disclosure.

An additional experiment was used to confirm this amine exchange chemistry at the Ge IE NC core surface. FIG. 6a shows the $^1$H NMR spectra of the vinylic proton resonance (H') region of OAm, where n-hexadecylamine was used to dilute the same functionalized Ge IE NC sample in toluene-d$_8$. At a 1:1 ratio of OAm/hexadecylamine (not shown), the vinylic resonance of OAm is buried into the baseline in comparison to the reference solution without Ge IE NCs. When the dilution ratio was increased to 1:100, the vinylic resonance shifted upfield due to concentration effects and sharpened to resemble the free OAm molecule as the initial groups functionalizing the Ge NCs were displaced. This experiment confirms the result from exchange experiments with excess OAm that exchange with amines occurs rapidly on the NMR time scale.

Figure 6B:
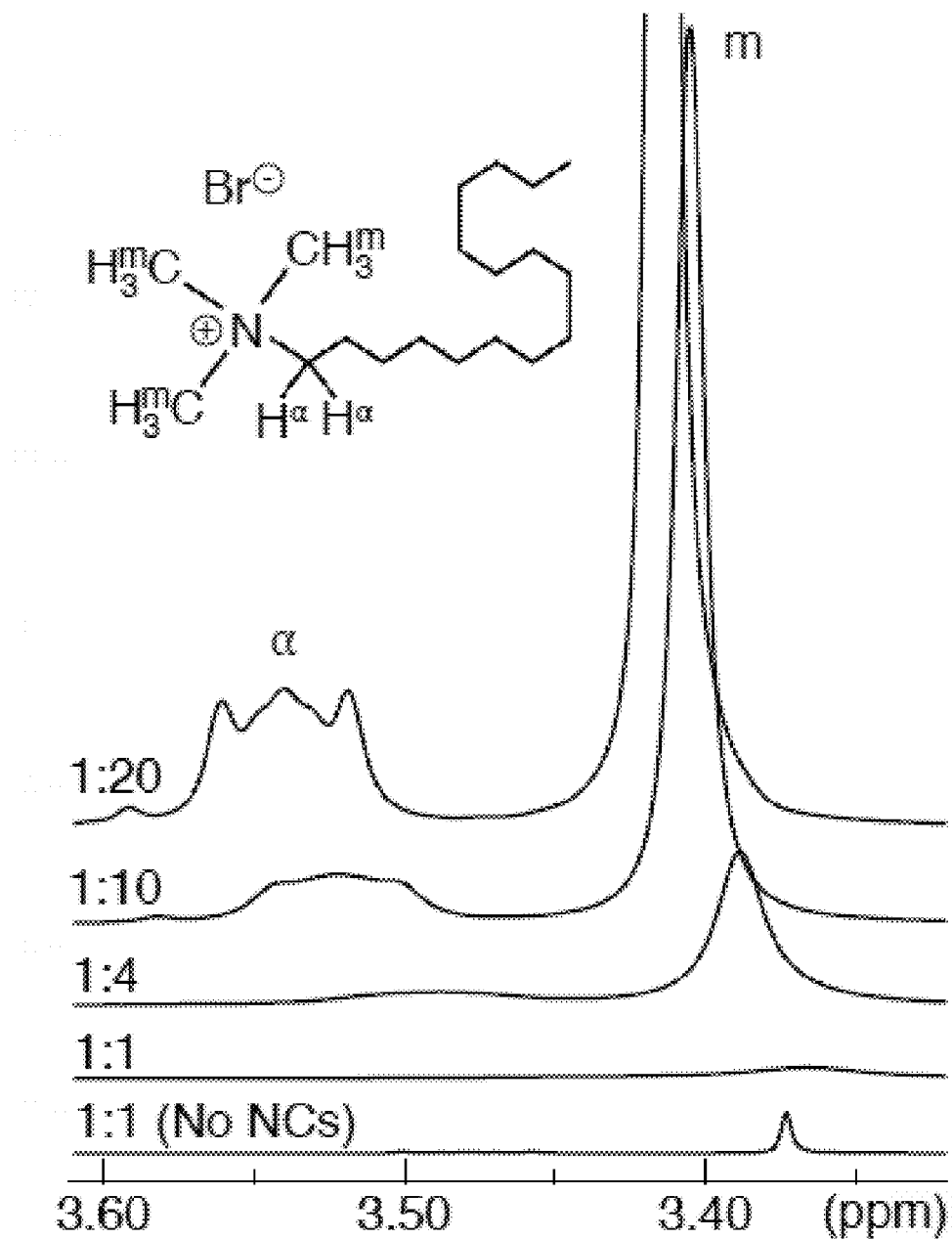
FIG. 6b illustrates $^1$H NMR spectra of Ge NCs dispersed in DCM after three methanol washes and dilution with cetyltrimethylammonium bromide (CTAB) and a CTAB reference spectrum without Ge NCs, according to some embodiments of the present disclosure.

Since the above data rule out an amide interaction (Ge—NHR), two other bonding motifs between the amine-based ligands and the Ge NC core surface are possible. First, neutral alkylamines may bind as an L-type neutral inner sphere complex (also called a dative or dipolar bond) to form hypervalent Ge NC surface atoms. Alternatively, cationic alkylammonium (RNH$_3^+$) groups may interact through a non-coordinative ionic bond with negatively-charged Ge NC surface atoms to form an outer sphere complex. To differentiate between the two motifs, the same functionalized Ge IE NC sample was diluted with cetyltrimethylammonium bromide (CTAB; cetyl=hexadecyl) in dichloromethane-d$_2$ (DCM) at varying ratios to the existing ligand (DCM was used owing to the good solubility of CTAB in this solvent relative to toluene). The $^1$H NMR spectra in FIG. 6b show the aminomethyl (H$^m$) and methylene protons (H$^\alpha$) of the cetyltrimethylammonium cation (CTA$^+$). At a 1:1 ratio OAm/CTA$^+$, the H$^m$ and H$^\alpha$ proton resonances are significantly broadened in comparison to a reference solution without Ge NCs. Similar to the two previous experiments, the vinylic proton resonance of the OAm molecules also emerges from the spectral baseline with increasing CTAB concentration, which is consistent with ligand exchange. The resonances shift with concentration and sharpen as the OAm/CTA$^+$ ratio is increased to 1:20. Since there is no driving force for CTA$^+$ to exchange with a neutral amine (i.e., proton exchange is not possible), one may conclude that an ionic bonding motif exists at the Ge NC surface where CTA$^+$ exchanges with olelyammonium (OAmH$^+$) residing at the negatively charged Ge NC core surface.

Figure 6C:
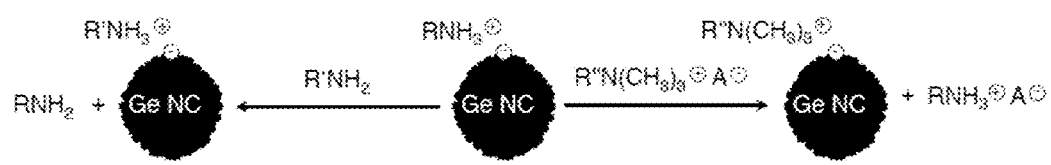
FIG. 6c illustrates a cationic ligand exchange scheme, according to some embodiments of the present disclosure.

FIG. 6c depicts this new cationic surface ligand exchange reaction in the presence of excess neutral amine or tertiary ammonium salt. For exchange with a neutral primary (or secondary) amine to occur, a proton is transferred from an alkylammonium (RNH$_3^+$) ligand at the Ge IE NC core surface to the incoming neutral amine (R'NH$_2$) to yield a R'NH$_3^+$ ligand and a free RNH$_2$ molecule. This exchange reaction from surface-bound OAmH$^+$ may need a Lewis base that is about as basic as OAm (pKa ~10). For instance, exchange reaction may proceed with primary alkylamines such as hexadecylamine (pKa of hexadecylamine is 10.1) but may not for aniline (pKa of aniline is 4.9). In the tertiary ammonium salt case, charge balance may necessitate that the anion (A$^-$) is transferred from the tertiary ammonium (RN(CH$_3$)$_3^+$) salt to the surface-bound RNH$_3^+$ to yield an alkylammonium salt (RNH$_3^+$A$^-$) in solution and the RN(CH$_3$)$_3^+$ ligand associated with the Ge IE NC as an outer sphere complex.

Figure 7A:
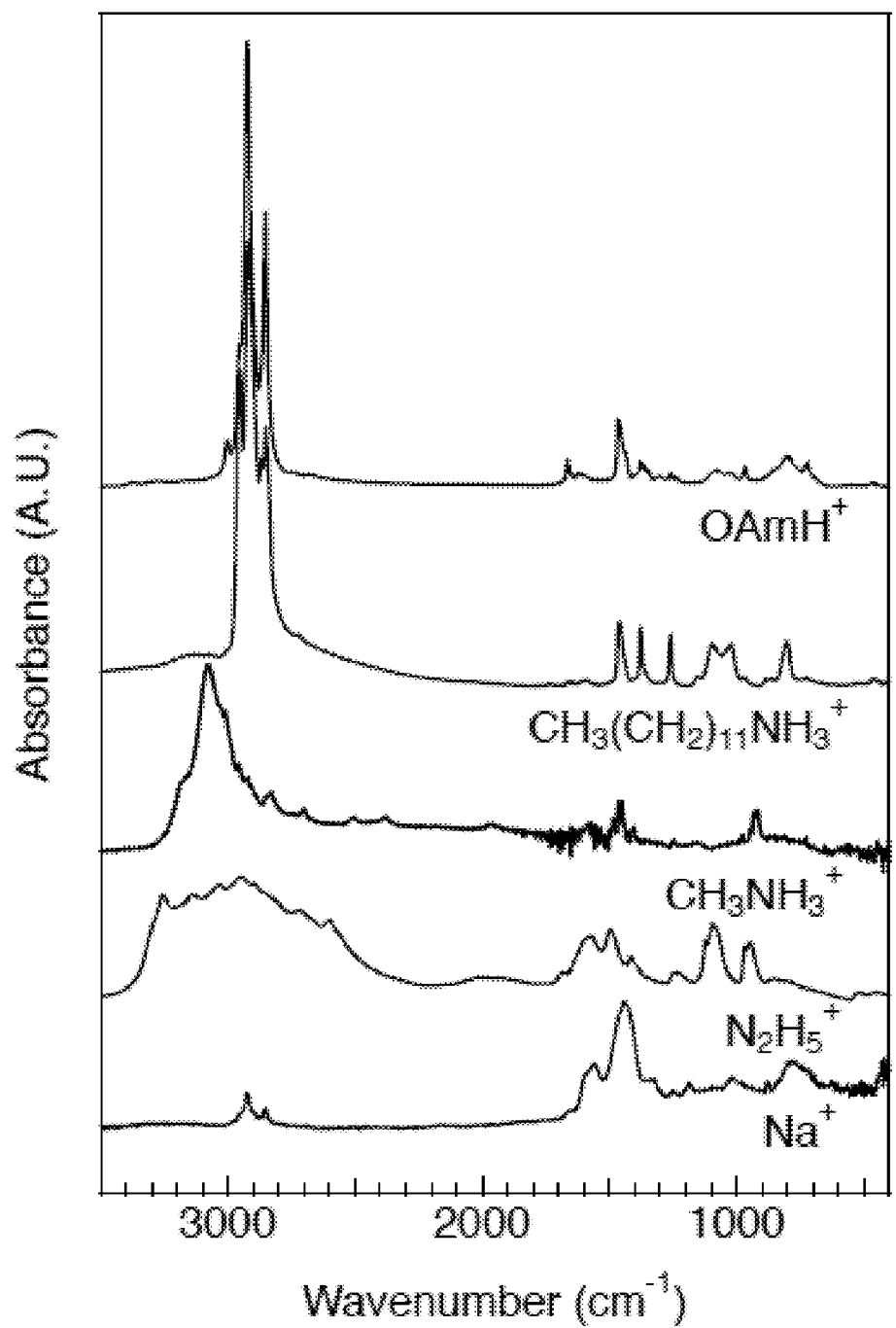
FIG. 7a illustrates FTIR spectra of oleylammonium ($OAmH^+$)-functionalized Ge NC films exchanged with cationic ligands: dodecylammonium ($CH_3(CH_2)_{11}NH_3^+$), methylammonium ($CH_3NH_3^+$), hydrazinium ($N_2H_5^+$), and sodium ($Na^r$), according to some embodiments of the present disclosure.

This is the first example of ionic ligand functionalization and exchange on group IV NCs. The versatility of this ligand motif is illustrated in FIG. 7a, which shows FTIR spectra for Ge IE nanocrystalline films having a variety of cationic surface ligands. The top spectrum is of a dip-coated Ge IE nanocrystalline film functionalized with native OAmH$^+$ surface ligands. These surface ligands were exchanged in solution by adding 5 mL of 1 M solution of dodecylamine in toluene. Exchanged Ge IE NCs were isolated by precipitating the Ge IE NCs with a methanol antisolvent and re-dispersing in toluene. The exchange reaction is apparent from the disappearance of the OAm vinylic stretching and deformation modes at 3005 cm$^{-and}$ 1667 cm$^{-1}$, respectively, in the spectrum just below the top spectrum.

Solid-state exchange of IE surface ligands by submersing an insoluble film of NCs in a ligand exchange solution is demonstrated herein as an effective strategy for the OAmH$^+$-functionalized Ge starting nanocrystalline films described herein by assembling films in a layer-by-layer fashion. Films were built up until signal from the surface ligand could be observed in the IR spectra, so films with short ligands required thicker films (e.g. Na$^+$-functionalized Ge starting nanocrystalline films appear opaque whereas OAmH$^+$-functionalized IE nanocrystalline films are semi-transparent). Exchange for short surface ligands, such as methylammonium (CH$_3$NH$_3^+$) and ammonium (NH$_4^+$), was achieved by dipping starting films in iodide salt solutions in dimethylformamide (DMF). Ge IE NCs functionalized with CH$_3$NH$_3^+$ surface ligands are shown in the third spectrum from the top in FIG. 7a. (NH$_4^+$ data is not shown). In addition to NH$_4^+$, an all-inorganic Ge IE nanocrystalline film was produced after exchange in a 0.1 M hydrazine solution in acetonitrile to produce hydrazinium (N$_2$H$_5^+$)-functionalized Ge IE NCs as shown in the second spectrum from the bottom in FIG. 7a. It is further demonstrated that a third all-inorganic Ge IE nanocrystalline film with an extremely small alkali metal ligand, the sodium cation (Na$^+$, bottom spectrum), was produced by performing the exchange reaction in a saturated DMF solution of sodium tert-butoxide. The tert-butoxide anion provides a convenient handle to highlight that sodium binds to the Ge NC surface, not the organic anion, since the C—H$_x$ stretching modes of the native oleylammonium disappeared and the film is virtually devoid of any hydrocarbon residue following ligand exchange. Successful exchange with potassium was also achieved using potassium tert-butoxide in a saturated DMF solution (data not shown).

Figure 7B:
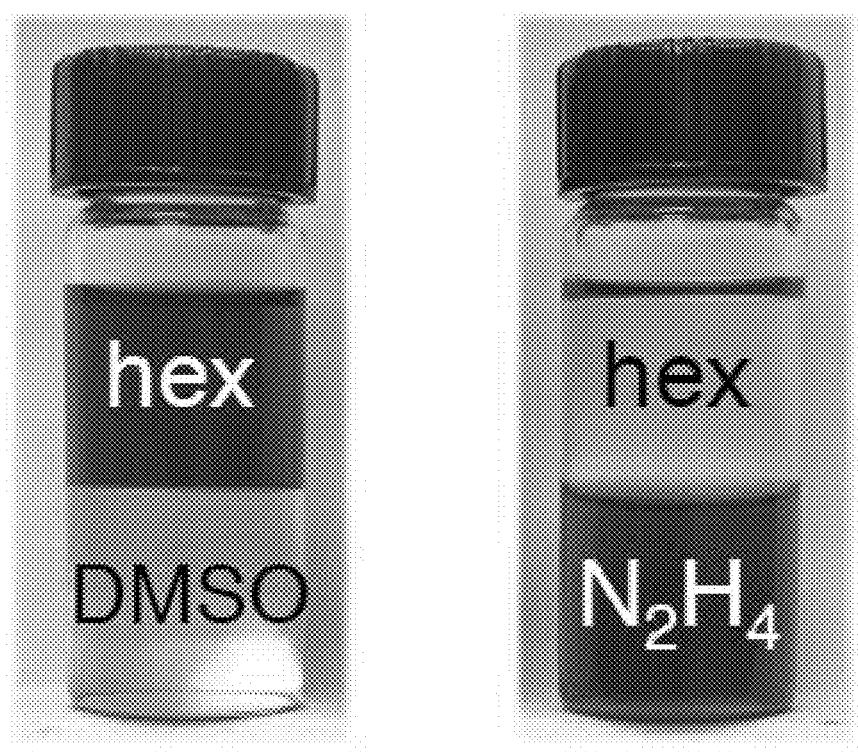
FIG. 7b illustrates a photograph (left) of a solution of $OAmH^+$-functionalized Ge NCs in hexane (hex) that do not phase transfer to dimethylsulfoxide (DMSO) and a photograph (right) of $N_2H_5^+$-functionalized Ge NCs in hydrazine ($N_2H_4$) after phase transfer from hexane, according to some embodiments of the present disclosure.

Cationic ligand exchange to produce Ge IE NCs with inorganic ligands was also successful in solution using a biphasic strategy. FIG. 7b shows a photograph (left) of OAmH[+]-functionalized Ge IE NCs in hexanes (hex) that did not phase transfer into the polar solvent dimethylsulfoxide (DMSO). When the same hexanes solution was layered over hydrazine, then the Ge IE NCs transferred to the hydrazine phase to yield a solution of $N_2H_5^+$-functionalized Ge IE NCs in less than 5 minutes (right photograph). This process enables deposition of all-inorganic Ge IE nanocrystalline films without the need for further chemical treatment to remove ligands.

Figure 8:
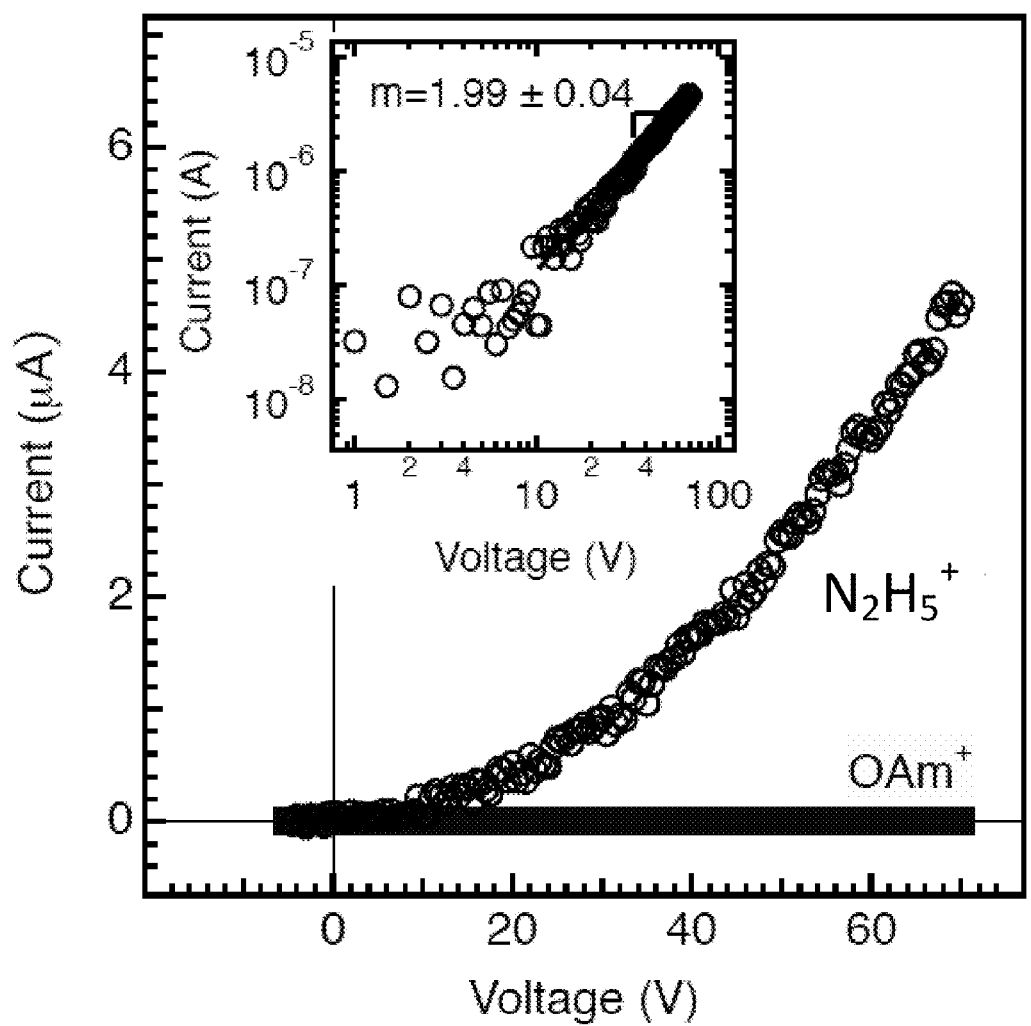
FIG. 8 illustrates current-voltage characteristics of $OAm^+$-functionalized Ge NC film and after hydrazine treatment to produce $N_2H_5^+$-functionalized Ge NCs, according to some embodiments of the present disclosure. The inset is a log-log plot of the same data showing the square-law-dependence of the current.

Ligand exchange is an integral tool in the development of NC-based optoelectronic devices. Two devices are shown herein that leverage cationic ligand exchange. The first device demonstrates that this ligand exchange greatly enhances inter-NC electronic coupling in a Ge IE nanocrystalline film. A Ge IE nanocrystalline film was formed by dipping a silicon wafer with a 110 nm-thick thermal oxide and pre-deposited aluminum electrodes into a 20 mg mL$^{-1}$ solution of OAm to form a OAmH[+]functionalized Ge IE nanocrystalline film. There was no measureable current through the film (see FIG. 8). This Ge IE nanocrystalline film was then exchanged by submersing it into a 0.1 M solution of hydrazine in acetonitrile (ACN) and rinsed with neat ACN. The process was repeated 2-3 times to build up a continuous film of $N_2H_5^+$-functionalized Ge NCs. The exchanged films were conductive, and current was proportional to $V^2$ at biases greater than 10 V, which is characteristic to space-charge-limited current (SPLC). The SPLC model was applied to calculate a carrier mobility of 0.15 cm$^2$ V$^{-1}$ s$^{-1}$ at bias between 10 and 70 V. This value is an order of magnitude larger than the field effect mobility observed in other Ge NC thin film transistors.

Figure 9A:
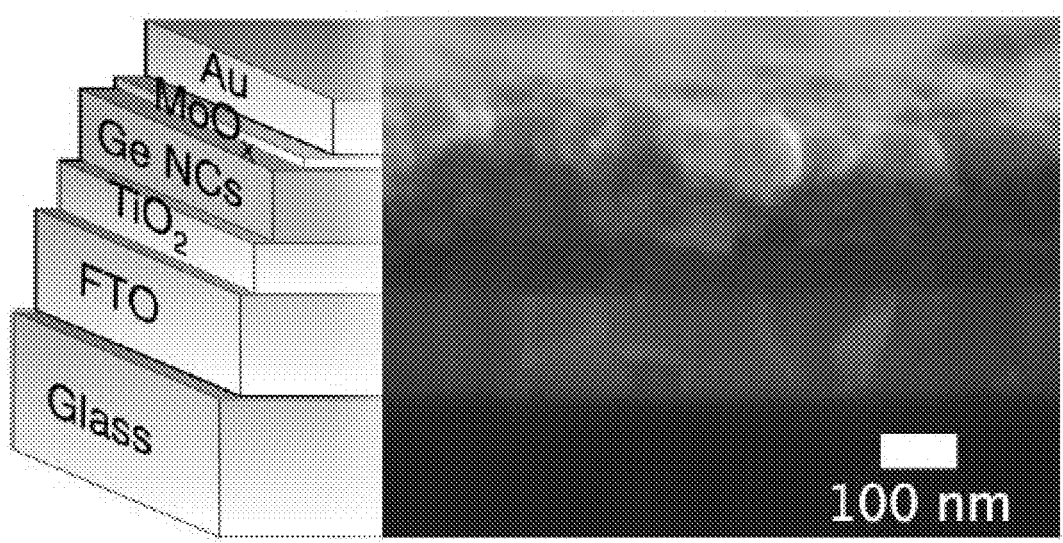
FIG. 9a illustrates an SEM image showing Ge NC-based device stack, according to some embodiments of the present disclosure.
Figure 9B:
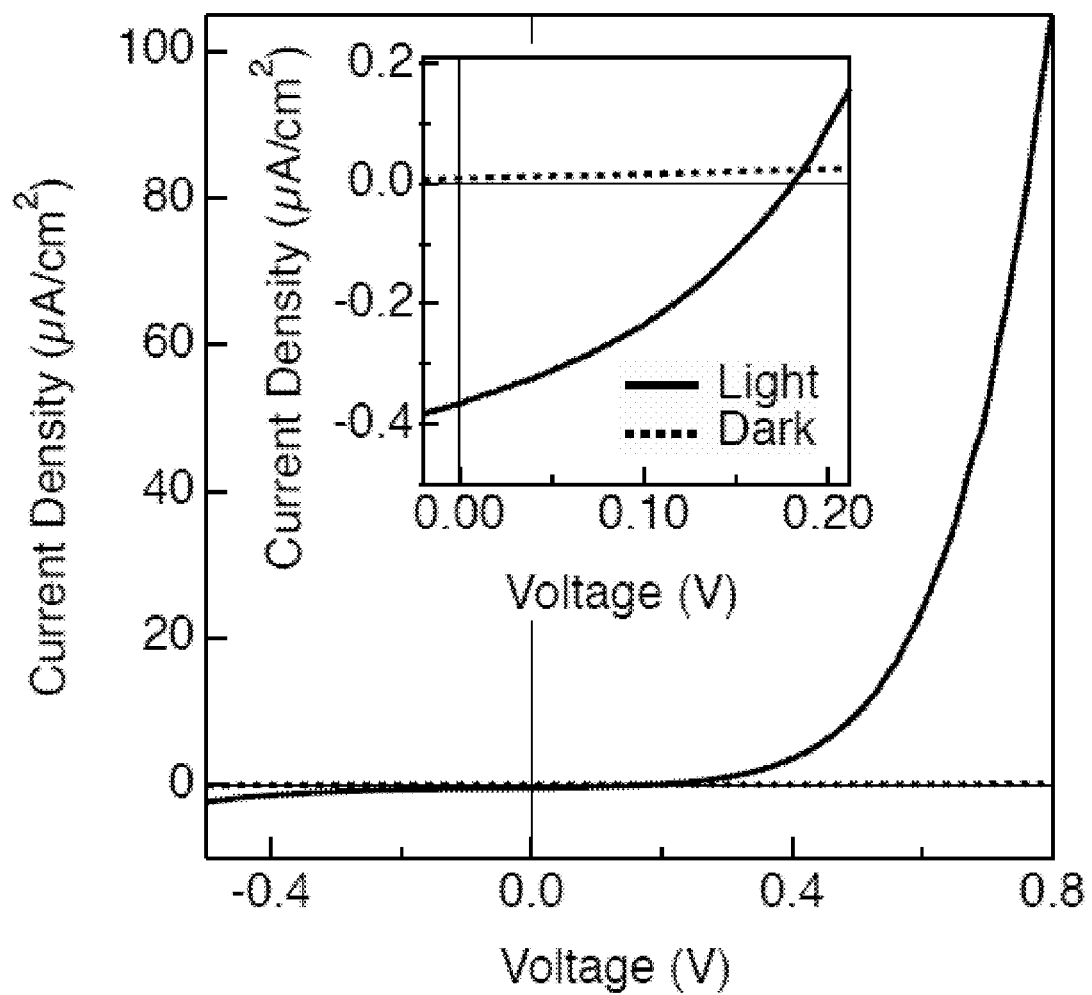
FIG. 9b illustrates light (solid lines) and dark (dashed lines) current-voltage curves of the device fabricated with a $Na^+$-functionalized Ge NC absorber layer, according to some embodiments of the present disclosure. The inset illustrates a zoom-in of the same data to show PV characteristics.
Figure 10:
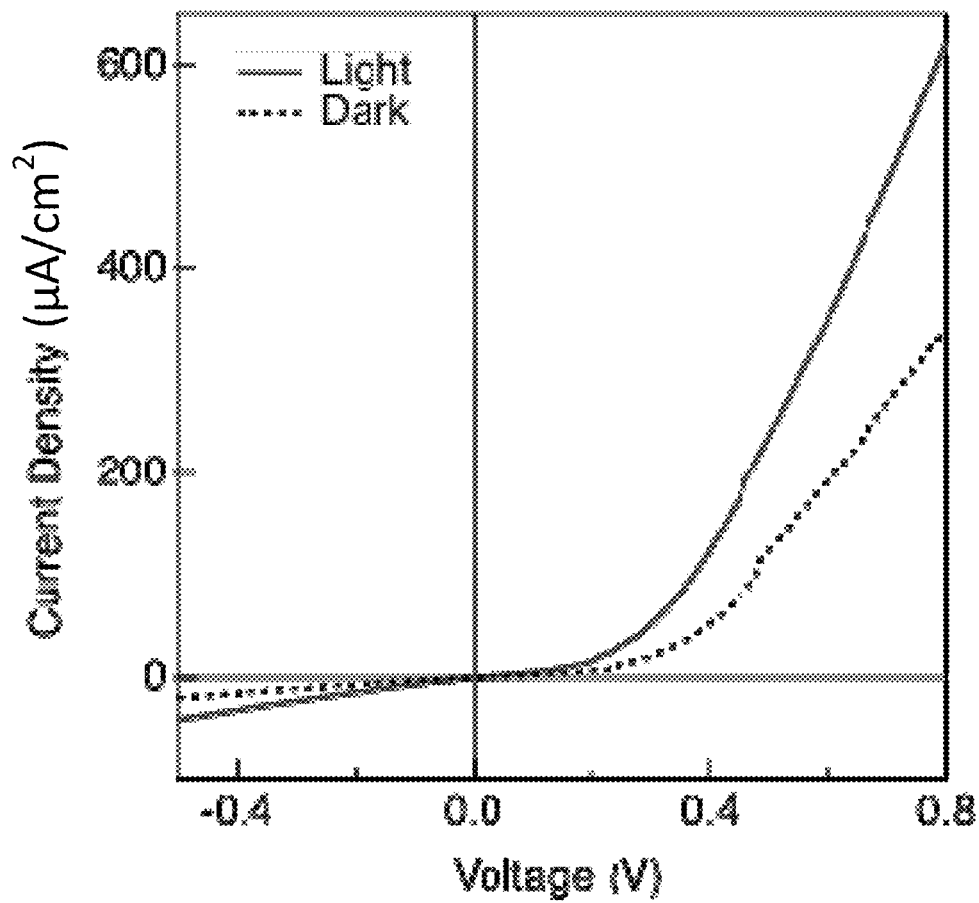
FIG. 10 illustrates current-voltage characteristics of control device fabricated in an identical manor to FIG. 9a but without a Ge NC absorber layer, according to some embodiments of the present disclosure.

The cationic ligand exchange process described herein was also utilized to produce a photoactive device based on all-inorganic Ge IE nanocrystalline films cast from solution. FIG. 9a shows a scanning electron microscopy (SEM) image of the device cross-section. The device features a 100 nm-thick absorber layer of Na[+]-functionalized Ge IE NCs deposited using layer-by-layer assembly between hole (MoO$_x$/Au) and electron (TiO$_2$/FTO) contact layers that were optimized for metal chalcogenide NC photovoltaic devices. No optimization for the Ge IE NC absorber layer was performed. FIG. 9b shows the current density as a function of voltage for the device in the dark (dashed line) and under AM 1.5 illumination (solid line). The device displayed current rectification and excellent diode behavior under illumination with an on/off ratio of 560 at 0.8 V, which is a factor of ~5 greater than previous Ge NC-based photodetectors. A control device without the Ge NC layer was fabricated and showed a negligible (<2) on/off ratio at 0.8 V (see FIG. 10). The Ge NC device also exhibited a photovoltaic effect shown in the inset of FIG. 9b with an open-circuit voltage of 0.18 V, a short-circuit current of 0.37 µA cm$^{-2}$, a fill factor of 0.36, and power conversion efficiency of 2.×10$^{-5}$%. These characteristics are comparable to Ge NC poly(3-hexylthiophene) composites absorbers.

This work demonstrates room-temperature alkylammonium functionalization of Ge starting NCs synthesized from germane (GeH$_4$) in a nonthermal plasma. FTIR and quantitative $^1$H NMR were employed to show the alkylammonium surface ligands are readily exchanged in solution as well as in the solid state. Solid-state exchange utilizing inorganic cationic ligands is shown to yield all-inorganic Ge IE nanocrystalline films, which enabled demonstration of thin film transistors, photodetectors and photovoltaic behavior from all-inorganic Ge IE nanocrystalline films cast from solution. Most importantly, the cationic surface ligand exchange chemistry at group IV NC surfaces established by this work finally opens the ligand exchange toolbox to enable significant strides to be made toward viable optoelectronic technologies based on earth-abundant, non-toxic group IV nanomaterials.

Materials: Toluene-d$_8$ (Aldrich, 99.6%) was dried over sodium, distilled, and then vacuum transferred after three freeze-pump-thaw cycles on a Schlenk line. Dichloromethane-d$_2$ (DCM, Aldrich, 99.5%) was dried over calcium hydride and vacuum transferred after three freeze-pump-thaw cycles on a Schlenk line. Oleylamine (OAm) was heated to 100° C. under vacuum overnight. Hexadecyltrimethylammonium bromide (CTAB, Aldrich, 95%) was dried under vacuum for 48 h at room temperature in the presence of P$_2$O$_5$. Stock solutions of 1.0 M, 0.10 M, and 0.010 M OAm, 0.1 M and 0.0025 M ferrocene, 0.1 M CTAB in DCM, and 1.0 M HDA in toluene-d$_8$ were prepared in the glovebox.

Gas-phase Synthesis of GE starting NCs: Ge starting NCs were prepared using a custom-built nonthermal plasma reactor. 10% germane (GeH$_4$) in helium and an argon carrier gas were passed through a quartz reactor tube with 7 mm inner diameter and 9 mm outer diameter. The plasma was ignited by applying a forward power of at 13.56 MHz via an Advanced Energy Cesar 136 generator through an Advanced Energy VM1000 matching network (tuned to give a reflected power of 0-1 W) to a copper electrode wrapped around the reactor tube. A grounded electrode was positioned downstream and separated by a 1.5 cm tall ceramic spacer. An Advanced Energy Z'Scan device was used to dynamically monitor the plasma conditions from which the delivered power could be calculated. Ge starting NCs were collected downstream from the plasma on a 400-mesh stainless steel filter and transferred via load-lock to an inert-atmosphere glove box for collection. Flow rates, composition, pressure, and power are varied to produce a number of Ge starting NC sizes. These conditions are provided in Table 1, and x-ray diffraction patterns of the resulting Ge starting NCs are supplied in FIG. 3.

TABLE 1

Reactor conditions for plasma synthesis of Ge Starting NCs

| NC diameter (nm) | Ar flow (sccm) | GeH$_4$ (10% in He) (sccm) | H$_2$ flow (sccm) | Pressure (torr) | Delivered Power (W) |
|---|---|---|---|---|---|
| 3.4 | 90 | 30 | 30 | 2.5 | 6.77 |
| 3.6 | 90 | 30 | 30 | 3 | 5.74 |
| 3.9 | 90 | 30 | 0 | 4 | 8.10 |
| 4.4 | 90 | 30 | 30 | 5 | 15.0 |
| 4.8 | 120 | 30 | 0 | 6 | 8.15 |
| 5.9 | 120 | 30 | 0 | 6 | 10.1 |
| 7.8 | 30 | 30 | 0 | 6 | 9.10 |
| 16.5 | 90 | 30 | 30 | 6 | 9.60 |

Ge IE NC Surface Functionalization: The sulfide functionalization solution was prepared by dissolving commercially-available aqueous solution (20 wt %) of ammonium sulfide ((NH$_4$)$_2$S) into a primary amine, such as OAm. The solution was prepared in air inside of a chemical hood. In a typical preparation, a mixture of 5 mmol of (NH$_4$)$_2$S (ca. 0.8 mL) and 10 mL of OAm was stirred at room temperature for 10 min in a capped vial to obtain a viscous, transparent, light-yellow solution. A portion of the sulfide solution (1.0 mL) was added to hydride-terminated Ge starting NCs suspended in 5-10 mL of toluene and stirred overnight (typically, ~12 h) to yield a dark, uniform toluene phase that separated from a colorless aqueous phase. Functionalized Ge IE NCs were washed by precipitating the Ge IE NCs with methanol (30-50 mL) and re-dispersing in hexanes or toluene (5-10 mL). Small amounts (~10 µL) of OAm were needed to fully re-disperse in toluene after washing. Water and excess solvent was removed by pulling vacuum on a Schlenk line before the Ge IE NCs were returned to the glovebox for further characterization.

Figure 11:
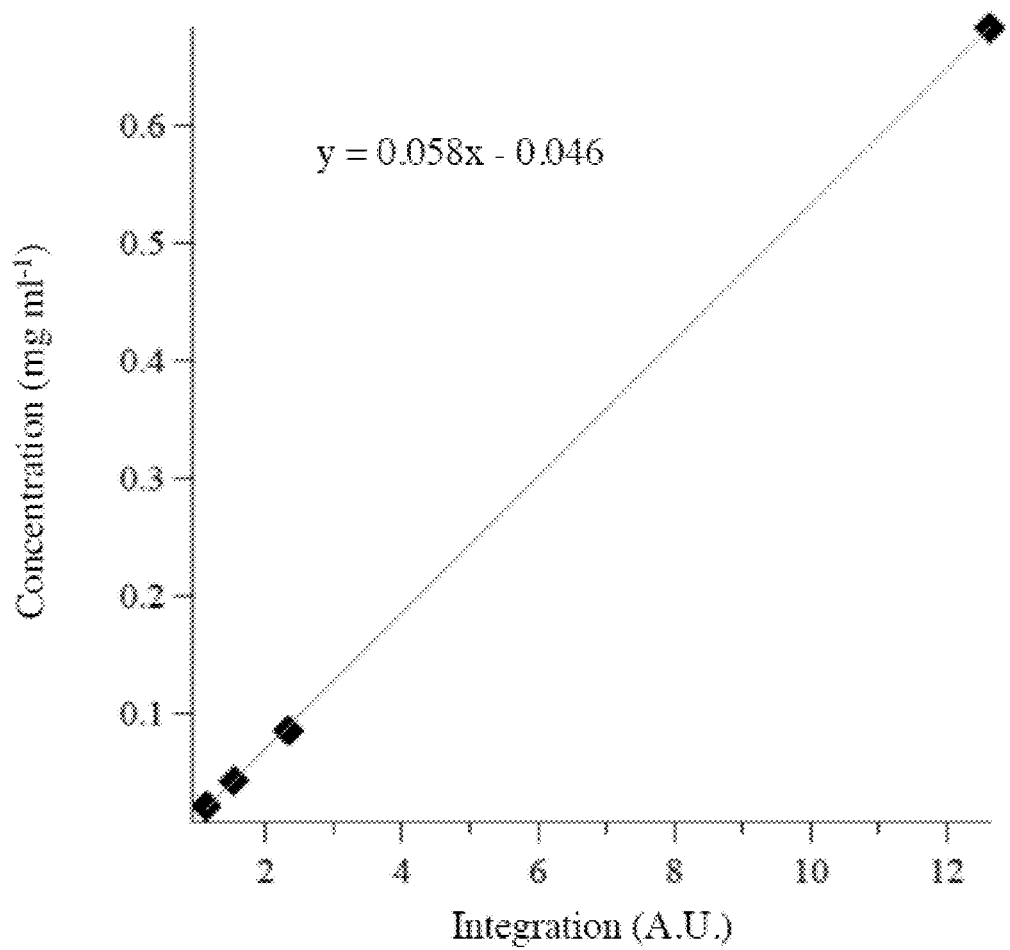
FIG. 11 illustrates a standard curve used to determine Ge NC concentration in $^1$H NMR studies, according to some embodiments of the present disclosure.

Ge NC Standard Curve: Ge NCs suspended in hydrazine were used to establish a standard curve. UV-Vis absorbance spectra were taken using a 1 cm path length quartz cuvette in an Agilent Technologies UV-Vis spectrophotometer equipped with tungsten and deuterium lamps. Integrations of each spectrum between 815 and 825 nm were taken. The integration values were plotted versus concentration and the data was fit with a linear function (see FIG. 11).

$^1$H NMR: All $^1$H NMR samples were prepared in an inert-atmosphere glovebox. Functionalized Ge IE NCs (~20 mg) were precipitated from a hexane solution with acetonitrile, centrifuged, and left under vacuum (40 mTorr) overnight to remove trace amounts of non-deuterated solvents. The NCs were then re-dispersed using toluene-$d_8$ and small amounts (~10 µL) of 0.010 M OAm in toluene-$d_8$. A separate stock solution was prepared in the same manner using DCM. OAm was not needed to re-disperse the NCs in this case. NC concentration was held constant at 0.4 mg/mL across the OAm concentration study. NMR samples were prepared in J. Young tubes using 300 µL of re-dispersed NC solution in toluene-$d_8$ or DCM and diluted with a known amount of OAm, hexadecylamine, or CTAB solution. Adding a 20 µL aliquot of the internal standard, 0.1 M ferrocene, and finally toluene-$d_8$ or DCM to reach a final volume of 600 µL completes a sample.

NMR spectroscopy was performed on a Bruker 400 Avance III NMR. Spectra were taken using a standard proton pulse (zg), 64 scans, 4.0 s collection times, and a 25.0 s delay between scans at 25° C. The spectra were normalized to the ferrocene internal standard, and final OAm concentrations were determined by the ratio of the integrated area of the vinyl peak of OAm (5.8-5.1 ppm) to the ferrocene standard (4.3-3.7 ppm). NMR spectra were taken on OAm solutions of 0.330 M and 0.0033 M to confirm the results seen were not simply due to an increase in concentration of OAm.

Ge NC Device Fabrication: Ge NC films were prepared for coplanar electrical measurements by dipping a silicon wafer with a 110 nm-thick thermal oxide and pre-deposited electrodes (5 nm Ti/35 nm Au) into a 20 mg mL$^{-1}$ solution of OAmH$^+$-functionalized Ge IE NCs. The film is exchanged by submersing it into a 0.1 M solution of hydrazine in acetonitrile (ACN) and rinsed with neat ACN. The process is repeated 2-3 times to build up a continuous film of N$_2$H$_5^+$-functionalized Ge IE NCs. Coplanar electrical measurements were performed in a glovebox with a homemade probe station using a Keithley 236 source-measure unit. The mobility calculated by fitting the log-log current-voltage data of FIG. 8 to the Mott-Gurney Law for space-charge-limited current:

$$J = \frac{9}{8}\frac{\mu\varepsilon\varepsilon_0}{L}\left(\frac{V}{L}\right)^2$$

where J is the current density, V is the voltage, µ is the mobility, $\epsilon$ is the relative permittivity, $\epsilon_0$ is the permittivity of free space, L is the length between electrodes (10 µM). The cross-sectional conduction area is assumed to be the dimensions of the electrode, which is 40 nm (5 nm Ti/35 nm Au) by 1 mm.

The substrates for devices were pre-patterned FTO on 1"×1" glass purchased from Thin Film Devices. Silver bus bars (100 nm) were thermally evaporated just outside the edge of each device/pixel to lower the series resistance due to the extended FTO cathode. Meanwhile, a TiO$_2$ sol-gel solution was prepared by mixing 5 mL of anhydrous ethanol, 2 drops of hydrochloric acid, 125 µL of deionized water and then adding 375 µL of titanium ethoxide (Sigma-Aldrich, ≥97%) dropwise while stirring the mixture. The resulting sol-gel solution was stirred for at least 24 hours before use. Before depositing the TiO$_2$, the substrates were cleaned with ethanol and dried with pressurized N$_2$. The TiO$_2$ layer was deposited onto the substrates by spin coating ~70 µL of the sol-gel at 3000 rpm for 30 seconds. The films were then annealed at 150° C. on a hotplate for 30 min and then placed in a 450° C. oven for 30 min. The TiO$_2$ deposition and annealing were performed in air.

The Ge NCs were deposited onto the TiO$_2$-coated substrates inside of a N$_2$-filled glovebox (O$_2$<0.1 ppm, H$_2$O<0.1 ppm) via a layer-by-layer dip-coating process. All chemicals were purchased anhydrous and then further dried before bringing into the glovebox. The substrates are first dipped into a solution of OAmH$^+$-terminated Ge IE NCs in DCM. After drying, the films are then dipped into a saturated solution of sodium tertbutoxide in acetonitrile for ~2 s. The film is then immediately dipped into neat acetonitrile (~5 s) to rinse off excess sodium tertbutoxide and the exchanged ligand. This process was repeated ~20 times to yield 100-200 nm Ge NC films.

The devices were finished by thermally evaporating 20 nm of molybdenum oxide (MoO$_x$) and ~100 nm of metal (Al or Au) as the hole transport layer and top electrode, respectively. Samples were placed in a thermal evaporation chamber (Ångstrom Engineering) that was pumped to roughly 10$^{-7}$ Torr. The MoO$_3$ interlayer was deposited at 0.2 Å s$^{-1}$. Next, without breaking vacuum, 100 nm of Al or Au was evaporated under the same conditions as for the other samples. The films were transferred between the gloveboxes via a transfer capsule to avoid air-exposure.

The solar cells were characterized inside of another N$_2$-filled glovebox (again, transferred air-free) using a Newport solar simulator calibrated with a Si photodiode (Hamamtsu, S1787-04). The active area of each device was 0.101 cm$^2$ but a 0.059 cm$^2$ aperture was used during measurements under illumination.

Example 1

A method comprising: reacting a starting nanocrystal comprising a starting nanocrystal core and a covalently bound surface species to create an IE nanocrystal comprising a surface charge and a first IE surface ligand ionically bound to the surface charge, wherein: the starting nanocrystal core comprises a group IV element.

Example 2

The method of Example 1, wherein the group IV element comprises germanium.

Example 3

The method of Example 1, wherein the covalently bound surface species comprises at least one of hydrogen, a saturated hydrocarbon, an unsaturated hydrocarbon, a halogen, or a chalcogen.

Example 4

The method of Example 3, wherein the saturated hydrocarbon comprises an alkyl group.

Example 5

The method of Example 3, wherein the unsaturated hydrocarbon comprises an aryl group.

Example 6

The method of Example 3, wherein the chalcogen comprises at least one of oxygen, sulfur, selenium, or tellurium.

Example 7

The method of Example 1, wherein the surface charge is substantially negative.

Example 8

The method of Example 7, wherein the first IE surface ligand has a charge that is substantially positive.

Example 9

The method of Example 8, wherein the first IE surface ligand comprises at least one of an alkylammonium ligand, a phosphonium ligand, a hydrazinium ligand, or an alkali metal ligand.

Example 10

The method of Example 9, wherein the first IE surface ligand comprises at least one of $OAmH^+$, $CH_3(CH_2)_{11}NH_3^+$, $CH_3NH_3^+$, $N_2H_5^+$, or $Na^+$.

Example 11

The method of Example 1, wherein the surface charge is substantially positive.

Example 12

The method of Example 11, wherein the first IE surface ligand has a charge that is substantially negative.

Example 13

The method of Example 12, wherein the first IE surface ligand comprises at least one of $BF_4^-$, $ClO_4^-$, $PF_6^-$, $(C_6H_5)_4B^-$, or $(C_6F_5)_4B^-$.

Example 14

The method of Example 1, wherein the reacting replaces at least a portion of the covalently bound surface species with the first IE surface ligand.

Example 15

The method of Example 1, wherein after the reacting, at least a portion of the covalently bound surface species remains covalently bound to the IE nanocrystal.

Example 16

The method of Example 1, wherein the reacting comprises contacting the starting nanocrystal with at least one of a reducing agent or an oxidizing agent.

Example 17

The method of Example 16, wherein the reducing agent comprises at least one of a sulfide, an alkali metal, an alkaline earth metal, an alkyllithium reagent, a Grignard reagent, a metal hydride, sodium borohydride, or dihydrogen.

Example 18

The method of Example 17, wherein the metal hydride comprises at least one of lithium aluminum hydride or sodium hydride.

Example 19

The method of Example 16, wherein the oxidizing agent comprises at least one of $NOBF_4$, $[(CH_3)_3O][BF_4]$, an elemental halide, or an elemental chalcogen.

Example 20

The method of Example 1, wherein the reacting comprises contacting the starting nanocrystal with at least one of a cation-forming species or an anion-forming species.

Example 21

The method of Example 1, wherein the at least one of the cation-forming species or the anion-forming species comprises a salt.

Example 22

The method of Example 1, further comprising exchanging at least a portion of the first IE surface ligand with a second IE surface ligand.

Example 23

The method of Example 22, wherein: the second IE surface ligand is different from the first IE surface ligand, and the second IE surface ligand comprises at least one of an alkylamonium ligand, a phosphonium ligand, a hydrazinium ligand, or an alkali metal ligand.

Example 24

A nanoparticle comprising: an IE nanoparticle core comprising a surface charge and a group IV element; and an IE surface ligand ionically bound to the surface charge.

Example 25

The nanoparticle of Example 24, wherein the group IV element comprises germanium.

Example 26

The nanoparticle of Example 25, wherein the surface charge is substantially negative.

Example 27

The nanoparticle of Example 26, wherein the IE surface ligand has a charge that is substantially positive.

Example 28

The nanoparticle of Example 27, wherein the IE surface ligand comprises at least one of an alkylammonium ligand, a phosphonium ligand, a hydrazinium ligand, or an alkali metal ligand.

Example 29

The nanoparticle of Example 28, wherein the IE surface ligand comprises at least one of $OAmH^+$, $CH_3(CH_2)_{11}NH_3^+$, $CH_3NH_3^+$, $N_2H_5^+$, or $Na^+$.

Example 30

The nanoparticle of Example 25, wherein the surface charge is substantially positive.

Example 31

The nanoparticle of Example 30, wherein the IE surface ligand has a charge that is substantially negative.

Example 32

The nanoparticle of Example 31, wherein the IE surface ligand comprises at least one of $BF_4^-$, $ClO_4^-$, $PF_6^-$, $(C_6H_5)_4B^-$, or $(C_6F_5)_4B^-$.

Example 33

The nanoparticle of Example 24, further comprising a surface species covalently bound to the IE nanoparticle core.

Example 34

The nanoparticle of Example 33, wherein the surface species comprises at least one of hydrogen, a saturated hydrocarbon, an unsaturated hydrocarbon, a halogen, or a chalcogen.

Example 35

The nanoparticle of Example 34, wherein the saturated hydrocarbon comprises an alkyl group.

Example 36

The nanoparticle of Example 34, wherein the unsaturated hydrocarbon comprises an aryl group.

Example 37

The nanoparticle of Example 34, wherein the chalcogen comprises at least one of oxygen, sulfur, selenium, or tellurium.

Example 38

Example A mixture comprising: a first IE nanocrystal comprising a group IV element; and a second IE nanocrystal comprising a group IV element, wherein: the first IE nanocrystal is substantially positive in charge, the second IE nanocrystal is substantially negative in charge, and the first IE nanocrystal is ionically bound to the second IE nanocrystal.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
   contacting a starting nanocrystal with a precursor of a first ligand and at least one of an oxidizing agent or a reducing agent, wherein:
   the starting nanocrystal comprises a core having an outer surface and a starting ligand covalently bound to the outer surface,
   the contacting results in a removal of at least a portion of the starting ligand from the core and the formation of a first charge on the outer surface,
   the contacting results in the formation of the first ligand having a second charge opposite to the first charge,
   the second charge associates with the first charge to form a first nanocrystal comprising the first ligand ionically bound to the core, and
   the first ligand is capable of being reversibly exchanged with a second ligand to form a second nanocrystal comprising the second ligand ionically bound to the core.

2. The method of claim 1, wherein the core comprises a group IV element.

3. The method of claim 2, wherein the group IV element comprises germanium.

4. The method of claim 1, wherein the starting ligand comprises at least one of hydrogen, a saturated hydrocarbon, an unsaturated hydrocarbon, a halogen, or a chalcogen.

5. The method of claim 1, wherein the first charge is negative.

6. The method of claim 5, wherein the first ligand comprises at least one of an alkylammonium, a phosphonium, a hydrazinium, or an alkali metal.

7. The method of claim 6, wherein the first ligand comprises at least one of oleylammonium, $CH_3(CH_2)_{11}NH_3^+$, $CH_3NH_3^+$, $N_2H_5^+$, or $Na^+$.

8. The method of claim 1, wherein the first charge is positive.

9. The method of claim 8, wherein the first ligand comprises at least one of $BF_4^-$, $ClO_4^-$, $PF_6^-$, $(C_6H_5)_4B^-$, or $(C_6F_5)_4B^-$.

10. The method of claim 1, wherein the contacting removes substantially all of the starting ligand.

11. The method of claim 1, wherein the reducing agent comprises at least one of a sulfide, an alkali metal, an alkaline earth metal, an alkyllithium reagent, a Grignard reagent, a metal hydride, sodium borohydride, or dihydrogen.

12. The method of claim 1, wherein the oxidizing agent comprises at least one of $NOBF_4$, $[(CH_3CH_2)_3O][BF_4]$, an elemental halide, or an elemental chalcogen.

13. The method of claim 1, wherein the precursor of the first ligand comprises at least one of an alkali metal salt, oleylamine, hydrazine, ammonia, an amine, or a phosphine.

14. The method of claim 1, further comprising:
an additional contacting of the first nanocrystal with a precursor of the second ligand, wherein:
the additional contacting results in the forming of the second nanocrystal, and
the second ligand is different from the first ligand.

15. A nanoparticle comprising:
a core comprising a group IV element and an outer surface having a surface charge; and
a first ligand comprising a charge opposite of the surface charge, wherein:
the first ligand is ionically bound to the core, and
at least a portion of the first ligand is capable of being reversibly exchanged with a second ligand.

16. The nanoparticle of claim 15, wherein the group IV element comprises germanium.

17. The nanoparticle of claim 15, wherein:
the first ligand comprises at least one of oleylammonium, $Na^+$, $NR_xH_y^+$, or $PR'_vH_w^+$, and
R is a first organic group, R' is a second organic group, y=4−x, and w=4−v.

18. The nanoparticle of claim 15, wherein the first ligand comprises at least one of $BF_4^-$, $ClO_4^-$, $PF_6^-$, $(C_6H_5)_4B^-$, or $(C_6F_5)_4B^-$.

* * * * *